(12) United States Patent
Choi et al.

(10) Patent No.: US 9,762,829 B2
(45) Date of Patent: Sep. 12, 2017

(54) IMAGE SENSOR AND METHOD OF DRIVING IMAGE SENSOR, AND IMAGE CAPTURING APPARATUS USING THE SAME

(71) Applicant: Samsung Electronics Co., Ltd., Suwon-si, Gyeonggi-do (KR)

(72) Inventors: Jaehyuk Choi, Seoul (KR); Jungsoon Shin, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 91 days.

(21) Appl. No.: 14/813,202

(22) Filed: Jul. 30, 2015

(65) Prior Publication Data

US 2016/0037110 A1    Feb. 4, 2016

(30) Foreign Application Priority Data

Jul. 30, 2014    (KR) ........................ 10-2014-0097612

(51) Int. Cl.
*H04N 5/369* (2011.01)
*H04N 5/378* (2011.01)
(Continued)

(52) U.S. Cl.
CPC .......... *H04N 5/3698* (2013.01); *H03M 1/002* (2013.01); *H04N 5/23241* (2013.01);
(Continued)

(58) Field of Classification Search
CPC ........... H04N 1/00885; H04N 1/00896; H04N 1/00904; H04N 5/23245; H04N 5/23241; H04N 5/3698; H04N 5/378; H03M 1/002
See application file for complete search history.

(56) References Cited

U.S. PATENT DOCUMENTS 6,137,432 A    10/2000  Xiao
6,958,776 B2 *  10/2005  Mendis ................. H04N 5/361
                                                        250/208.1
(Continued)

FOREIGN PATENT DOCUMENTS

KR         20090012055 A    2/2009
KR      10-2010-0092771 A    8/2010

OTHER PUBLICATIONS

Seok, Mingoo et al. "The Phoenix Processor: A 30pW Platform for Sensor Applications." 2008 Symposium on VLSI Circuits Digest of Technical Papers, 2008 IEEE.
(Continued)

*Primary Examiner* — Daniel M Pasiewicz
(74) *Attorney, Agent, or Firm* — Harness, Dickey & Pierce, P.L.C.

(57) ABSTRACT

According to one example embodiment, an image sensor is configured to operate in a plurality of operation modes. The image sensor includes a pixel array including unit pixels configured to generate an analog image signal from incident light, a readout circuit configured to generate a digital image signal by converting the analog image signal, and a control module configured to generate control signals for controlling operations of the pixel array and the readout circuit according to an operation mode of the image sensor. A first power voltage for driving the image sensor when the operation mode of the image sensor is an image recognition mode for recognizing a body of a user of the image sensor, is lower than a second power voltage for driving the image sensor when the operation mode of the image sensor is an image capture mode for capturing images by the user.

20 Claims, 19 Drawing Sheets

(51) Int. Cl.
    *H04N 5/232*    (2006.01)
    *H03M 1/00*     (2006.01)
    *G06K 9/00*     (2006.01)
(52) U.S. Cl.
    CPC ......... *H04N 5/23245* (2013.01); *H04N 5/378*
        (2013.01); *G06K 9/00362* (2013.01); *H04N*
                                    *5/23219* (2013.01)

(56) References Cited

U.S. PATENT DOCUMENTS

| | | | |
|---|---|---|---|
| 7,286,180 B2 | 10/2007 | Barna et al. | |
| 8,218,051 B2 | 7/2012 | Krymski | |
| 8,605,173 B2 | 12/2013 | Lee et al. | |
| 8,847,136 B2* | 9/2014 | Ayers | H01L 27/14609 250/208.1 |
| 2004/0218088 A1* | 11/2004 | Borg | H04N 5/235 348/362 |
| 2005/0046721 A1* | 3/2005 | Harada | H04N 5/378 348/311 |
| 2007/0120982 A1* | 5/2007 | Oita | H04N 3/155 348/207.99 |
| 2013/0194184 A1* | 8/2013 | Kang | G06F 3/017 345/158 |
| 2014/0009648 A1* | 1/2014 | Kim | H04N 5/351 348/272 |
| 2015/0062397 A1* | 3/2015 | Koh | H04N 5/3594 348/302 |
| 2015/0199559 A1* | 7/2015 | Sztuk | H04N 5/23219 348/78 |
| 2016/0014363 A1* | 1/2016 | Kito | H04N 5/378 348/308 |
| 2016/0119522 A1* | 4/2016 | Choi | G06F 3/042 348/302 |

OTHER PUBLICATIONS

LiKamWa, Robert et al. "Energy Characterization and Optimization of Image Sensing Toward Continuous Mobile Vision." *MobiSys '13*, Jun. 25-28, Taipei, Taiwan.

Seok, Mingoo et al. "The Phoenix Processor: A 30pW Platform for Sensor Applications." 2008 Symposium on VLSI Circuits Digest of Technical Papers, 2008 IEEE.

Choi, Jaehyuk et al. "A 1.36 µW Adaptive CMOS Image Sensor with Reconfigurable Modes of Operation From Available Energy/Illumination for Distributed Wireless Sensor Network." 2012 IEEE International Solid-State Circuits Conference, ISSCC 2012, Session 6, Medical, Displays and Imagers, 6.2.

Choi, Jaehyuk et al. "A 3.4 µW CMOS Image Sensor with Embedded Feature-Extraction Algorithm for Motion-Triggered Object-of-Interest Imaging." 2013 IEEE International Solid-State Circuits Conference, ISSCC 2013, Session 27, Image Sensors, 27.1.

Kim, Gyouho et al. "A 467nW CMOS Visual Motion Sensor with Temporal Averaging and Pixel Aggregation." 2013 IEEE International Solid-State Circuits Conference, ISSCC 2013, Session 27, Image Sensors, 27.2.

\* cited by examiner

OPERATION MODE CHANGE SIGNAL

OPERATION MODE CHANGE SIGNAL

IMAGE SENSOR AND METHOD OF DRIVING IMAGE SENSOR, AND IMAGE CAPTURING APPARATUS USING THE SAME

CROSS-REFERENCE TO RELATED APPLICATION

This application claims the benefit of Korean Patent Application No. 10-2014-0097612, filed on Jul. 30, 2014, in the Korean Intellectual Property Office, the disclosure of which is incorporated herein in its entirety by reference.

BACKGROUND

1. Field

The present disclosure relates to an image sensor, a method of driving the image sensor, and an image capturing apparatus using the image sensor and the method.

2. Description of the Related Art

Image sensors are photoelectric conversion devices for converting incident light into electric signals. Image sensors may be classified into charge coupled device (CCD) image sensors and complementary metal oxide semiconductor (CMOS) image sensors according to the structures thereof.

Complementary metal oxide semiconductor (CMOS) image sensors are also called "CISs." According to the structure of pixels, CMOS image sensors may be classified into passive CMOS image sensors each including a single transistor and active CMOS image sensors each including three transistors. When compared to charge coupled device (CCD) image sensors, CMOS image sensors are manufactured through relatively easy processes and have more functions and low power consumption. Particularly, much attention has been given to CMOS image sensors in the field of mobile devices having an image capturing function because CMOS image sensors are suitable for achieving weight reduction, low power consumption, and a high degree of integration.

In addition, various sensors are included in recent mobile devices to provide more convenient functions to users. For example, sensors such as proximity sensors, illuminance sensors, and gyro sensors are integrated into mobile devices. However, if such sensors are continuously operated all the time, or more sensors are integrated into mobile devices, the mobile devices may consume more power, and thus the operation time of the mobile devices may be markedly decreased.

SUMMARY

Provided are an image sensor configured to operate in a plurality of operation modes having different power consumption and function, a method of driving the image sensor, and an image capturing apparatus using the image sensor and the method.

Additional aspects will be set forth in part in the description which follows and, in part, will be apparent from the description, or may be learned by practice of the presented example embodiments.

According to one example embodiment, an image sensor is configured to operate in a plurality of operation modes. The image sensor includes a pixel array including unit pixels configured to generate an analog image signal from incident light, a readout circuit configured to generate a digital image signal by converting the analog image signal, and a control module configured to generate control signals for controlling operations of the pixel array and the readout circuit according to an operation mode of the image sensor. A first power voltage for driving the image sensor when the operation mode of the image sensor is an image recognition mode for recognizing a body of a user of the image sensor, is lower than a second power voltage for driving the image sensor when the operation mode of the image sensor is an image capture mode for capturing images by the user.

In yet another example embodiment, each of the unit pixels may include: a photodiode configured to generate a charge by photoelectrically converting the incident light, a transfer transistor configured to transmit the charge generated by the photodiode to a floating diffusion (FD) node, a reset transistor configured to set a reset voltage level of the FD node by using a power voltage applied to a drain terminal of the reset transistor, a drive transistor configured to receive a voltage level of the FD node as an input to a gate terminal of the drive transistor, the drive transistor being connected to the reset transistor as a source follower, and a select transistor connected to a source terminal of the drive transistor and configured to obtain the voltage level of the FD node. When the operation mode of the image sensor is the image recognition mode, the transfer transistor may always be in an ON state.

In yet another example embodiment, when the operation mode of the image sensor is the image recognition mode, the reset transistor is configured to set the reset voltage level of the FD node connected to the photodiode by using the first power voltage, and the select transistor is configured to obtain the voltage level of the FD node changed by the incident light.

In yet another example embodiment, a circuit of each column of the readout circuit is configured to operate as a first circuit outputting a digital image signal by converting the analog image signal when the operation mode of the image senor is the image recognition mode, and operate as a second circuit outputting a digital image signal by amplifying the analog image signal and converting the amplified analog image signal when the operation mode of the image senor is the image capture mode. The first circuit and the second circuit share a plurality of elements.

In yet another example embodiment, the first circuit includes a successive approximation register analog-digital converter (SAR ADC), and the second circuit includes a programmable gain amplifier (PGA) and a single slope analog-digital converter (SS ADC).

In yet another example embodiment, the SAR ADC includes a capacitive digital-analog converter based on a capacitor array of the PGA, a memory based on a memory of a counter of the SS ADC, and a comparator based on a comparator of the PGA or the SS ADC.

In yet another example embodiment, the capacitive digital-analog converter is formed by connecting capacitor arrays respectively included in circuits of at least two neighboring columns of the readout circuit.

In yet another example embodiment, when the operation mode of the image senor is a motion detection mode for detecting a motion of the user or an image capturing apparatus including the image sensor, unit pixels of a row of the pixel array are used to generate the analog image signal, and a third power voltage for driving the image sensor in the motion detection mode is equal to the first power voltage.

In yet another example embodiment, circuits of columns of the readout circuit are configured to output a digital signal indicating whether a motion is detected or not by, sampling an image signal of a current frame of the unit pixels of the row and an image signal of a previous frame of the unit pixels of the row, and checking a difference signal between the sampled two image signals.

In yet another example embodiment, the readout circuit is configured to precharge a line with the third power voltage, the line being configured to connect latches in which digital signals output from the circuits of the columns of the readout circuit are respectively stored, and based on whether the line is discharged when the digital signals stored in the latches are simultaneously read, the readout circuit is configured to output whether a motion is detected.

In one example embodiment, a method of driving an image sensor configured to operate in a plurality of operation modes, includes generating a control signal based on an operation mode of the image senor, so as to control operations of a pixel array and a readout circuit, the pixel array including unit pixels, the readout circuit being configured to output a digital image signal by converting an analog image signal generated by the pixel array. The method further includes generating an analog image signal from incident light on the unit pixels of the pixel array according to the control signal and outputting a digital image signal by converting the analog image signal according to the control signal. A first power voltage for driving the image sensor when the operation mode of the image signal is an image recognition mode for recognizing a body of a user of the image sensor is lower than a second power voltage for driving the image sensor when the operation mode of the image senor is an image capture mode for capturing images by the user.

In yet another example embodiment, the generating of the analog image signal includes generating a charge by photoelectrically converting the incident light, transmitting the generated charge to an FD node via a transfer transistor; setting a reset voltage level of the FD node by using a power voltage applied to a drain terminal of a reset transistor, and obtaining a voltage level of the FD node using a select transistor connected to a source terminal of a drive transistor, the drive transistor receiving the voltage level of the FD node as an input to a gate terminal of the drive transistor and connected to the reset transistor as a source follower. When the operation mode of the image sensor is the image recognition mode, the transfer transistor may always be in an ON state.

In yet another example embodiment, when the operation mode of the image senor is the image recognition mode, the setting of the reset voltage level of the FD node includes setting the reset voltage level of the FD node connected to the photodiode by using the first power voltage, and the obtaining of the voltage level of the FD node includes obtaining the voltage level of the FD node changed by the light incident on the photodiode.

In yet another example embodiment, the outputting of the digital image signal may be performed by a circuit of each column of the readout circuit, the circuit operating as a first circuit to output the digital image signal by converting the analog image signal when the operation mode of the image senor is the image recognition mode, and as a second circuit to output the digital image signal by amplifying the analog image signal and converting the amplified analog image signal when the operation mode of the image senor is the image capture mode. The first circuit and the second circuit share a plurality of devices.

In yet another example embodiment, the first circuit includes an SAR ADC, and the second circuit includes a PGA and a SS ADC.

In yet another example embodiment, the SAR ADC includes a capacitive digital-analog converter based on a capacitor array of the PGA, a memory based on a memory of a counter of the SS ADC, and a comparator based on a comparator of the PGA or the SS ADC.

In yet another example embodiment, the capacitive digital-analog converter is formed by connecting capacitor arrays respectively included in circuits of at least two neighboring columns of the readout circuit.

In yet another example embodiment, when the operation mode of the image senor is a motion detection mode for detecting a motion of the user or an image capturing apparatus including the image sensor, the generating of the analog image signal may be performed using unit pixels of a row of the pixel array, and a third power voltage for driving the image sensor in the motion detection mode may be equal to the first power voltage.

In yet another example embodiment, the outputting of the digital image signal includes sampling an image signal of a current frame and an image signal of a previous frame by using circuits of columns of the readout circuit, the image signal of the current frame and the image signal of the previous frame being generated by the unit pixels of the row, and outputting a digital signal indicating whether a motion is detected by checking a difference signal between the sampled two image signals using the circuits of the columns of the readout circuit.

In yet another example embodiment, the outputting of the digital image signal includes precharging a line with the third power voltage, the line connecting latches in which digital signals output from the circuits of the columns of the readout circuit are respectively stored, and outputting whether a motion is detected based on whether the line is discharged when the digital signals stored in the latches are simultaneously read.

In one example embodiment, an image capturing apparatus configured to operate in a plurality of operation modes, includes an image sensor configured to output an image signal by converting incident light, a power supply unit configured to generate different power voltages, a control unit configured to determine an image recognition mode in which a body of a user of the image capturing apparatus is recognized or an image capture mode in which the user captures images as an operation mode of the image sensor, and a power change unit configured to apply a power voltage corresponding to the determined operation mode to the image sensor from the power supply unit. A first power voltage to be applied to the image sensor when the determined operation mode of the image sensor is the image recognition mode is lower than a second power voltage to be applied to the image sensor when the determined operation mode of the image sensor is the image capture mode.

In yet another example embodiment, if the control unit determines the operation mode to be a motion detection mode for detecting a motion of the user or the image capturing apparatus including the image sensor, an image signal corresponding to a row of a pixel array of the image sensor is generated, and a third power voltage for driving the image sensor in the motion detection mode may be equal to the first power voltage.

In yet another example embodiment, the image capturing apparatus further includes a user input unit configured to receive a user manipulation input. If the user inputs an image capturing request in the image recognition mode, the control unit is configured to determine the image capture mode as the operation mode of the image senor, and if the control unit does not recognize the body of the user for a predetermined period of time in the image recognition mode, the control unit may determine the motion detection mode as the operation mode of the image senor.

As described above, according to the one or more of the above example embodiments, the size and power consumption of the image capturing apparatus including the image senor may be minimized.

In one example embodiment, an image sensor includes a pixel array, a readout circuit, and a processor. The processor is configured to generate one of a plurality of control signals for controlling operations of the pixel array and the readout circuit, each of the plurality of control signals corresponding to one of a plurality of modes of operation of the image sensor, the plurality of modes of operation including at least an image recognition mode and an image capturing mode, the image sensor operating based on a lower power level in the image recognition mode compared to when the image sensor operates in the image capturing mode.

In yet another example embodiment, the plurality of modes of operation of the image sensor further includes a motion detection mode, and the image sensor is configured to operate based on the same power level as when the image sensor operates in the image recognition mode.

In yet another example embodiment, the pixel array is configured to generate an analog signal from an incident light. The pixel array includes a photodiode configured to generate a charge by photoelectrically converting incident light and a transfer transistor configured to transmit the charge generated by the photodiode to a floating diffusion (FD) node. The pixel array further includes a reset transistor configured to set a reset voltage level of the FD node by using a power voltage applied to a drain terminal of the reset transistor, a drive transistor configured to receive a voltage level of the FD node as an input to a gate terminal of the drive transistor, the drive transistor being connected to the reset transistor as a source follower, and a select transistor connected to a source terminal of the drive transistor and configured to obtain the voltage level of the FD node. When the image sensor is operating in the image recognition mode, the transfer transistor is always in an ON state.

In yet another example embodiment, when the image sensor is operating in the image recognition mode, the reset transistor is configured to set the reset voltage level of the FD node connected to the photodiode by using the first power voltage, and the select transistor is configured to obtain the voltage level of the FD node changed by the incident light.

In yet another example embodiment, the readout circuit is configured to output a digital signal by converting the analog image signal. A circuit of each column of the readout circuit is configured to, operate as a first circuit outputting a digital image signal by converting the analog image signal when the operation mode of the image senor is the image recognition mode, and operate as a second circuit outputting a digital image signal by amplifying the analog image signal and converting the amplified analog image signal when the operation mode of the image senor is the image capture mode. The first circuit and the second circuit share a plurality of elements.

In yet another example embodiment, an apparatus includes the image sensor of claim 24.

In yet another example embodiment, the apparatus is at least one of a camera, a mobile device, a portable electronic device.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION OF EXAMPLE EMBODIMENTS

Figure 1:
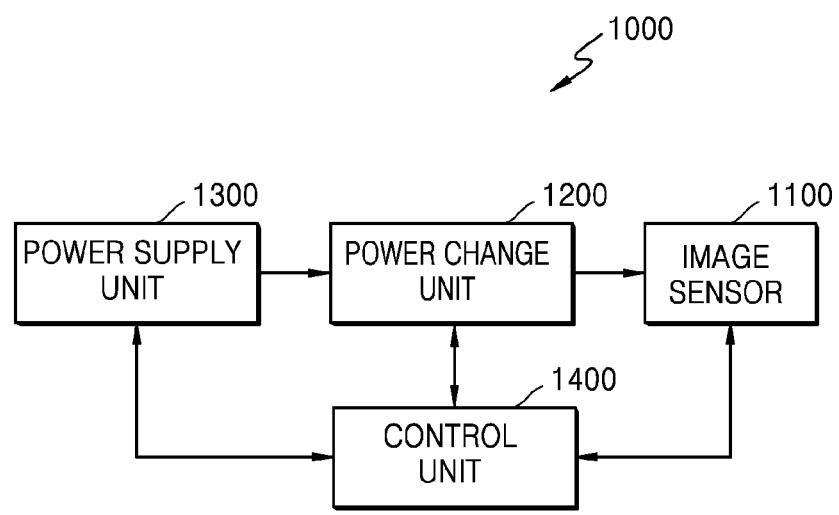
FIG. 1 is a block diagram illustrating an image capturing apparatus according to an example embodiment.

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following descriptions of example embodiments, expressions or terms such as "constituted by," "formed by," "include," "comprise," "including," and "comprising" should not be construed as always including all specified elements, processes, or operations, but may be construed as not including some of the specified elements, processes, or operations, or further including other elements, processes, or operations.

In addition, although the terms "first" and "second" are used to describe various elements, these elements should not be limited by these terms. These terms are only used to distinguish one element from another element.

Example embodiments relate to an image sensor, a method of driving the image sensor, and an image capturing apparatus using the image sensor and the driving method. In the following descriptions of example embodiments, those well-known to those of ordinary skill in the art will not be described in detail.

FIG. 1 is a block diagram illustrating an image capturing apparatus 1000 according to an example embodiment. Those of ordinary skill in the art may easily understand that the image capturing apparatus 1000 may further include other general-use elements in addition to elements illustrated in FIG. 1.

The image capturing apparatus 1000 may be a mobile device, a wearable device, or a stationary device equipped with a camera for capturing images. For example, the image capturing apparatus 1000 may be a digital camera, a smartphone, or a smart TV having an image capturing function.

Recent image capturing apparatuses have various convenient functions, and thus various sensors are included in the recent image capturing apparatuses. For example, sensors such as proximity sensors, illuminance sensors, or gyro sensors are included in image capturing apparatuses for recognizing user gestures made instead of touching screens. Particularly, the surrounding region of an image capturing apparatus has to be always sensed or monitored to realize such convenient functions, and thus sensors included in the image capturing apparatus may be required to have low power consumption for guaranteeing a long operation time in spite of a limited amount of battery capacity. However, if more sensors are included in an image capturing apparatus for providing various convenient functions to users, the operation time of the image capturing apparatus may be reduced because of a limited amount of battery capacity, and it may be difficult to reduce the size of the image capturing apparatus due to the increased number of sensors or sensor modules.

Hereinafter, an explanation will be given of an image sensor 1100 which is included in the image capturing apparatus 1000 and operable in a plurality of operation modes for sensing proximity, illuminance, and motions. In detail, for example, a complementary metal oxide semiconductor (CMOS) image sensor may be included in the image capturing apparatus 1000 for capturing high-quality or high-resolution images. However, the CMOS image sensor may consume a relatively large amount of power because the CMOS image sensor is specially designed for capturing high-quality or high-resolution images. Thus, a method and configuration may be required to capture low-quality or low-resolution images with a small amount of power by using the CMOS image sensor while maintaining the existing circuit structure of the CMOS image senor for capturing high-quality or high-resolution images. That is, the follow description provides an image sensor operable in a plurality of operation modes to capture high-quality or high-resolution images with a relatively large amount of power or low-quality or low-resolution images with a relatively small amount of power, and a method of driving the image sensor.

Referring to FIG. 1, the image capturing apparatus 1000 may include the image sensor 1100, a power change unit 1200, a power supply unit 1300, and a control unit 1400.

The image sensor 1100 may output an image signal by converting incident light. The image sensor 1100 may capture images by using the properties of a semiconductor sensitive to light. The image sensor 1100 may be a CMOS image sensor. The image sensor 1100 may be operated using relatively high power voltage applied from the power supply unit 1300 for capturing high-quality or high-resolution images. However, if the image sensor 1100 is operated using relatively high power voltage, the operation time of the image capturing apparatus 1000 may be decreased because of a large amount of power consumption by the image sensor 1100. When the image sensor 1100 is used instead of other sensors such as a proximity sensor, an illuminance sensor, or a gyro sensor, the image sensor 1100 may capture low-quality or low-resolution images instead of capturing high-quality or high-resolution images and may obtain information about proximity, illuminance, or motions by processing the captured low-quality or low-resolution images. In this case, the image sensor 1100 may be operated using a relatively low power voltage applied from the power supply unit 1300 in a manner different from the manner in which the image sensor 1100 captures high-quality or high-resolution images, and since the image sensor 1100 consumes a relatively small amount of power, the operation time of the image capturing apparatus 1000 may be increased.

The power supply unit 1300 may provide different power voltages. Since the image sensor 1100 is operated by different power voltages in different manners according to operation modes, the power supply unit 1300 may provide two or more power voltages.

The control unit 1400 may determine one of a plurality of operation modes as the operation mode of the image sensor 1100. The control unit 1400 may select one of a plurality of operation modes in which different functions are provided using different amounts of power. Then, the control unit 1400 may control the image sensor 1100 and the image capturing apparatus 1000 including the image sensor 1100 according to the selected operation mode.

The power change unit 1200 may apply a power voltage corresponding to the selected operation mode to the image sensor 1100 from the power supply unit 1300. In other words, the power change unit 1200 may select one of a plurality of power voltages generated by the power supply unit 1300 based on the operation mode selected by the control unit 1400 and may vary or maintain the selected power voltage so as to apply the selected power voltage to the image sensor 1100.

Figure 2:
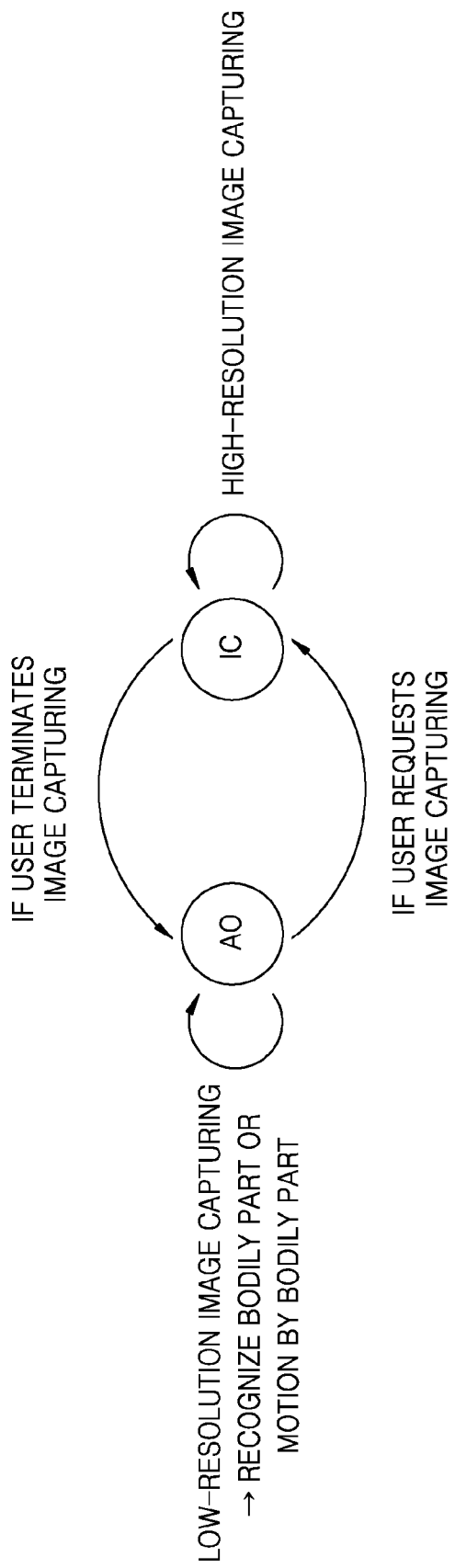
FIG. 2 is a view illustrating a plurality of operation modes of the image capturing apparatus according to an example embodiment.

FIG. 2 is a view illustrating a plurality of operation modes of the image capturing apparatus 1000 according to an example embodiment.

Referring to FIG. 2, the image capturing apparatus 1000 has two operation modes. In detail, the operation mode of the image capturing apparatus 1000 may be an image recognition mode or an image capture mode.

The image recognition mode supports capturing of low-quality or low-resolution images with a small amount of power. In the image recognition mode, the body of a user may be recognized from low-quality or low-resolution images captured with a relatively small amount of power.

That is, in the image recognition mode, the shape of a bodily part of a user or a motion made by a bodily part of a user may be recognized. For example, in the image recognition mode, the face or hand of a user may be recognized, or the eyes or gestures of a user may be recognized.

The image capture mode enables capturing of high-quality or high-resolution images with a relatively large amount of power. In the image capture mode, a user may capture high-quality or high-resolution images with a relatively large amount of power. For example, when a user captures still images or moving images using the image capturing apparatus 1000, the image capturing apparatus 1000 may be operated in the image capture mode.

The image sensor 1100 is operated in the image capture mode, that is, IC mode, only when images are captured and in the image recognition mode for most of the time. Thus, the image recognition mode may be referred to as an Always-ON mode, that is, an AO mode.

Referring to FIG. 2, if a user requests image capturing, the operation mode of the image capturing apparatus 1000 is changed from the image recognition mode to the image capture mode. For example, when a user executes a camera application of the image capturing apparatus 1000 to activate a camera function, the image capturing apparatus 1000 may switch from the image recognition mode to the image capture mode. Then, the user may capture high-resolution images in the image capture mode. In addition, if the user stops capturing of images, the image capturing apparatus 1000 may switch from the image capture mode to the image recognition mode. For example, if the user terminates the camera application running on the image capturing apparatus 1000 to deactivate the camera function, the image capturing apparatus 1000 may switch from the image capture mode to the image recognition mode. In the image recognition mode, the image capturing apparatus 1000 may capture low-resolution images with a relatively small amount of power and may recognize a bodily part of the user or a motion made by a bodily part of the user by using the captured low-resolution images. Hereinafter, how the image capturing apparatus 1000 operates in the plurality of operation modes shown in FIG. 2 will be described in more detail with reference to FIG. 3.

Figure 3:
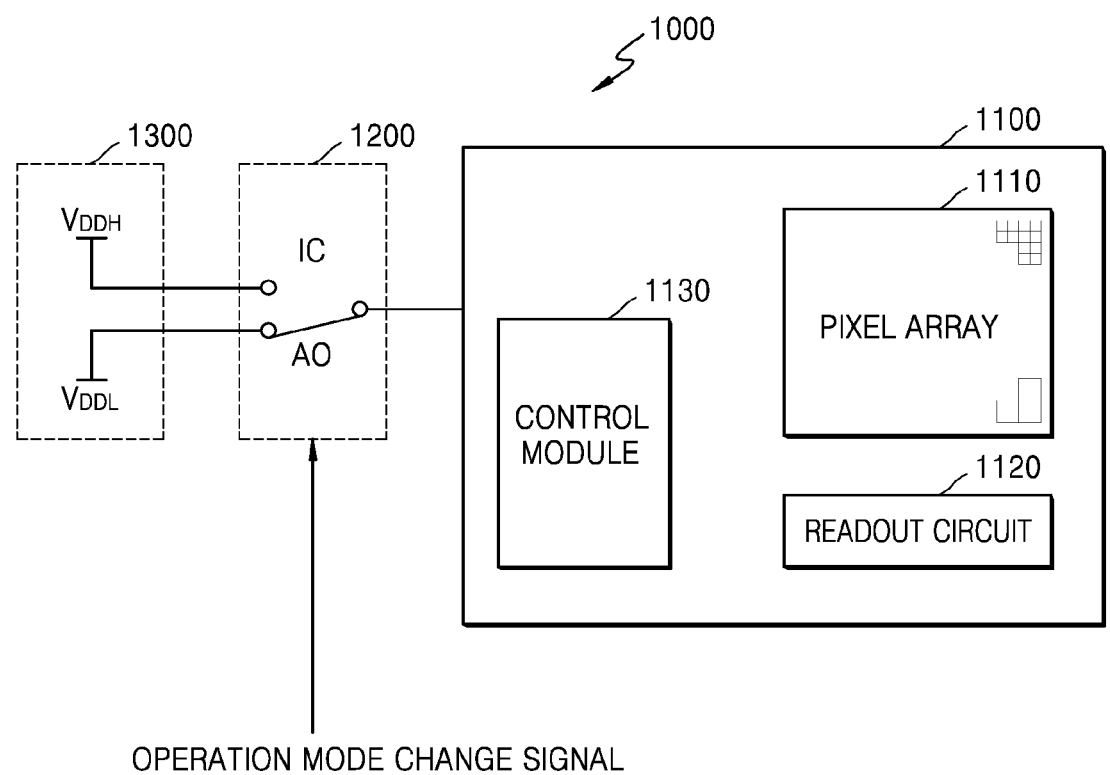
FIG. 3 is a view illustrating operations of the image capturing apparatus according to an example embodiment.

FIG. 3 is a view illustrating operations of the image capturing apparatus 1000 according to an example embodiment.

Referring to FIG. 3, the power change unit 1200 may be disposed between the image sensor 1100 and the power supply unit 1300. According to an operation mode change signal input from the control unit 1400, the power change unit 1200 may select one of a plurality of power voltages generated by the power supply unit 1300.

For example, if the control unit 1400 determines the image recognition mode as the operation mode of the image sensor 1100, an operation mode change signal indicating that the operation mode of the image sensor 1100 is the image recognition mode may be sent from the control unit 1400 to the power change unit 1200. Then, the power change unit 1200 may change or maintain its circuit connection based on the received operation mode change signal so as to select a power voltage corresponding to the image recognition mode from the plurality of power voltages generated by the power supply unit 1300 (hereinafter, the selected power voltage may be referred to as a "first power voltage"). On the contrary, if the control unit 1400 determines the image capture mode as the operation mode of the image sensor 1100, an operation mode change signal indicating that the operation mode of the image sensor 1100 is the image capture mode may be sent from the control unit 1400 to the power change unit 1200. Then, the power change unit 1200 may change or maintain its circuit connection based on the received operation mode change signal so as to select a power voltage corresponding to the image capture mode from the plurality of power voltages generated by the power supply unit 1300 (hereinafter, the selected power voltage may be referred to as a "second power voltage").

If the power change unit 1200 includes a switching device as shown in FIG. 3, the switching device may be switched according to an operation mode change signal input from the control unit 1400. For example, if the control unit 1400 determines the image recognition mode as the operation mode of the image sensor 1100, the power change unit 1200 may switch the switching device so that a relatively low power voltage $V_{DDL}$ of the power voltages generated by the power supply unit 1300 may be applied to the image sensor 1100. On the other hand, if the control unit 1400 determines the image capture mode as the operation mode of the image sensor 1100, the power change unit 1200 may switch the switching device so that a relatively high power voltage $V_{DDH}$ of the power voltages generated by the power supply unit 1300 may be applied to the image sensor 1100.

The image sensor 1100 may include a pixel array 1110, a readout circuit 1120, and a control module 1130. Those of ordinary skill in the art may easily understand that the image sensor 1100 may further include other general-use elements in addition to the elements illustrated in FIG. 3.

The pixel array 1110 may include unit pixels 1111 (which will be described below with reference to FIG. 5) configured to convert incident light into an analog image signal. The pixel array 1110 may convert incident light into an analog image signal by different methods according to the operation mode of the image sensor 1100 determined by the control unit 1400. In other words, the control module 1130 may generate a control signal so as to control operations of the pixel array 1110 based on the operation mode of the image sensor 1100 determined by the control unit 1400. This will be described later with reference to FIGS. 6, 7A, and 7B.

The readout circuit 1120 may output a digital image signal by converting the analog image signal generated by the pixel array 1110. The readout circuit 1120 may convert the analog image signal into the digital image signal by different methods according to the operation mode of the image sensor 1100 determined by the control unit 1400. In other words, the control module 1130 may generate a control signal so as to control operations of the readout circuit 1120 based on the operation mode of the image sensor 1120 determined by the control unit 1400. This will be described later with reference to FIGS. 8 and 9.

The control module 1130 may generate control signals so as to control operations of the pixel array 1110 and the readout circuit 1120 based on the operation mode of the image sensor 1100 determined by the control unit 1400. That is, the image sensor 1100 may be operated in two or more manners according to the operation mode of the image sensor 1100 determined by the control unit 1400. As described above, different power voltages may be applied to the image sensor 1100 from the power supply unit 1300 through the power change unit 1200 according to the operation mode of the image sensor 1100 determined by the control unit 1400, and the image sensor 1100 may be operated in different manners according to the power voltages. For example, if a relatively high power voltage is applied to the image sensor 1100, the image sensor 1100 may be operated by a method of using a high power voltage, and if a relatively low power voltage is applied to the image sensor 1100 to reduce power consumption, the image sensor 1100 may be operated by a method of using a low power voltage.

A first power voltage or a second power voltage may be applied to the image sensor 1100 from the power supply unit 1300 through the power change unit 1200 to operate the image sensor 1100 based on the operation mode determined by the control unit 1400. As described above, the first power voltage for driving the image sensor 1100 in the image recognition mode may be lower than the second power voltage for driving the image sensor 1100 in the image capture mode.

Hereinafter, the structure of the image sensor 1100 will be described in more detail with reference to FIG. 4.

Figure 4:
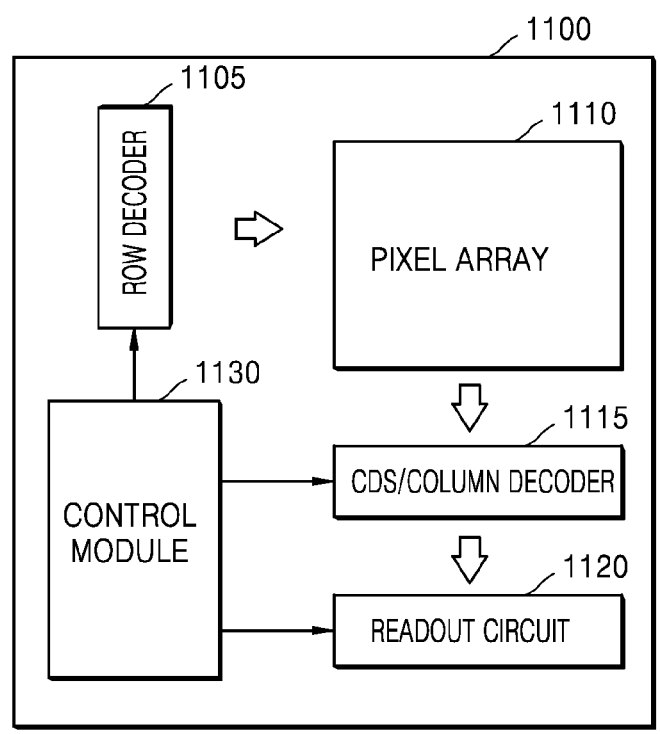
FIG. 4 is a block diagram illustrating an image sensor according to an example embodiment.

FIG. 4 is a block diagram illustrating the image sensor 1100 according to an example embodiment. Those of ordinary skill in the art may easily understand that the image sensor 1100 may further include other general-use elements in addition to elements illustrated in FIG. 4.

Referring to FIG. 4, the image sensor 1100 may include a row decoder 1105, the pixel array 1110, a correlated double sampling (CDS)/column decoder 1115, the readout circuit 1120, and the control module 1130.

As described above, the pixel array 1110 may include unit pixels 1111 configured to convert incident light into an analog image signal. The row decoder 1105 may decode row addresses of the pixel array 1110. The CDS/column decoder 1115 may remove fixed-pattern noises from the analog image signal output from the pixel array 1110 and may decode column addresses of the pixel array 1110. The readout circuit 1120 may adjust the intensity of the analog image signal and may convert the analog image signal into a digital image signal. The control module 1130 may control circuits of the image sensor 1100.

In the image sensor 1100, the pixel array 1110 is closely related with power consumption. The level of power voltage applied to the image sensor 1100 has an effect on the power consumption of the image sensor 1100 and the quality of images obtained using the image sensor 1100. In addition, the readout circuit 1120 of the image sensor 1100 is also closely related with power consumption. The power consumption of analog-digital converters (ADCs) of the readout circuit 1120 accounts for a large portion of the power consumption of the image sensor 1100. Hereinafter, operations of the pixel array 1110 in the plurality of operation modes will be described with reference to FIGS. 5 to 7, and operations of the readout circuit 1120 in the plurality of operation modes will be described with reference to FIGS. 8 to 10.

Figure 5:
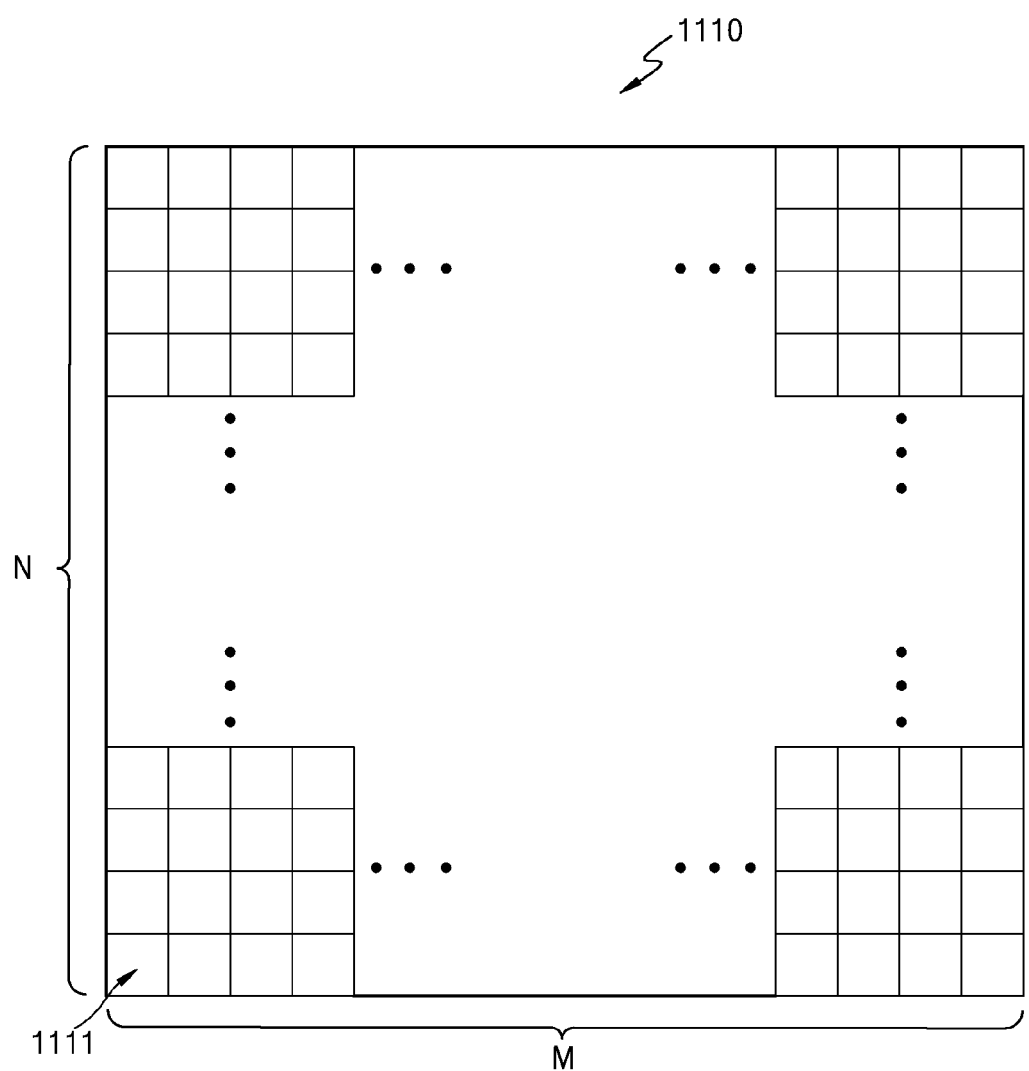
FIG. 5 is a view illustrating a pixel array of the image sensor according to an example embodiment.

FIG. 5 is a view illustrating the pixel array 1110 of the image sensor 1100 according to an example embodiment.

Referring to FIG. 5, the pixel array 1110 may include the unit pixels 1111. As shown in FIG. 5, the pixel array 1110 may include N×M unit pixels 1111. N and M may each be a positive integer equal to or greater than 1. N and M may have the same value or may have different values.

If the operation mode of the image sensor 1100 is the image capture mode, the pixel array 1110 may be operated so that high-resolution images may be obtained from the image sensor 1100. For example, the pixel array 1110 may be operated so that images having a full resolution of N×M may be obtained from the image sensor 1100. If the operation mode of the image sensor 1100 is the image recognition mode, the pixel array 1110 may be operated so that low-resolution images may be obtained from the image sensor 1100. For example, pixel values of neighboring unit pixels 1111 of the pixel array 1110 may be combined as a single pixel value to lower the resolution of images and the consumption of power.

Each of the unit pixels 1111 may include a photoelectric conversion device such as a photodiode, and a switching device such as a transistor. The pixel circuit structure of the unit pixels 1111 will be described with reference to FIG. 6.

Figure 6:
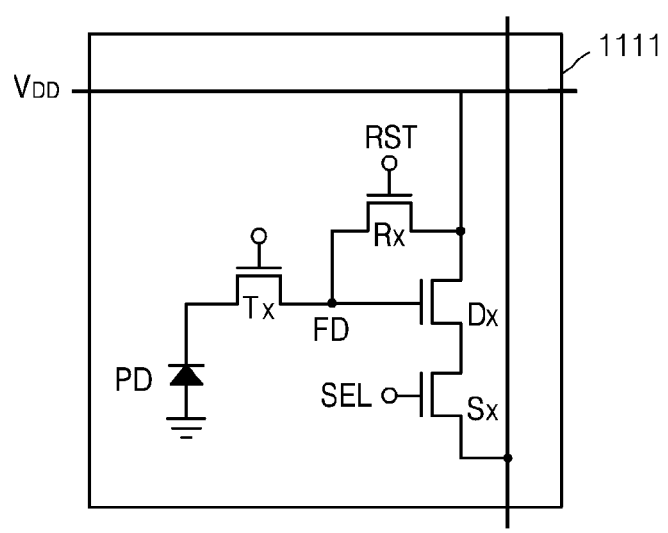
FIG. 6 is a view illustrating a pixel circuit of one of unit pixels of the pixel array according to an example embodiment.

FIG. 6 is a view illustrating a pixel circuit of one of the unit pixels 1111 of the pixel array 1110, according to an example embodiment. Those of ordinary skill in the art may easily understand that the unit pixel 1111 may further include other general-use elements in addition to elements illustrated in FIG. 6.

Referring to FIG. 6, the pixel circuit of the unit pixel 1111 of the pixel array 1110 may include a photodiode PD, and a plurality of transistors Tx, Rx, Dx, and Sx. The photodiode PD is a photoelectric conversion device capable of converting incident light into a charge and accumulating the charge. The photodiode PD may be a pinned photodiode. The transistors Tx, Rx, Dx, and Sx are switching devices capable of transmitting or blocking a charge according to a signal.

For example, as shown in FIG. 6, the pixel circuit of the unit pixel 1111 may include a photodiode PD, a reset transistor Rx, a transfer transistor Tx, a drive transistor Dx, and a select transistor Sx.

The transfer transistor Tx may transfer a photocharge generated by the photodiode PD to a floating diffusion (FD) node.

The reset transistor Rx may discharge a charge stored in the FD node to set a reference voltage level.

The drive transistor Dx may be connected as a source follower that drives a sample and hold circuit interfacing between the unit pixel 1111 and an amplifier.

The select transistor Sx may perform an addressing operation to read pixel voltages of rows of the pixel array 1110.

A power voltage $V_{DD}$ may discharge a charge stored in the FD node to which a photocharge generated by the photodiode PD will be transferred. In addition, the power voltage $V_{DD}$ may be applied to the reset transistor Rx that sets a reference voltage level and the drive transistor Dx that is connected as a source follower driving the sample and hold circuit for interfacing between the unit pixel 1111 and the amplifier.

The pixel circuit of the unit pixel 1111 of the pixel array 1110 of the image sensor 1100 may be operated in different manners according to the operation mode of the image sensor 1100. In other words, according to the operation mode of the image sensor 1100, the pixel circuit of the unit pixel 1111 may be operated by the first power voltage while consuming a relatively small amount of power or by the second power voltage while consuming a relatively large amount of power. Operations of the pixel circuit of the unit pixel 1111 will now be described with reference to FIGS. 7A and 7B.

Figure 7A:
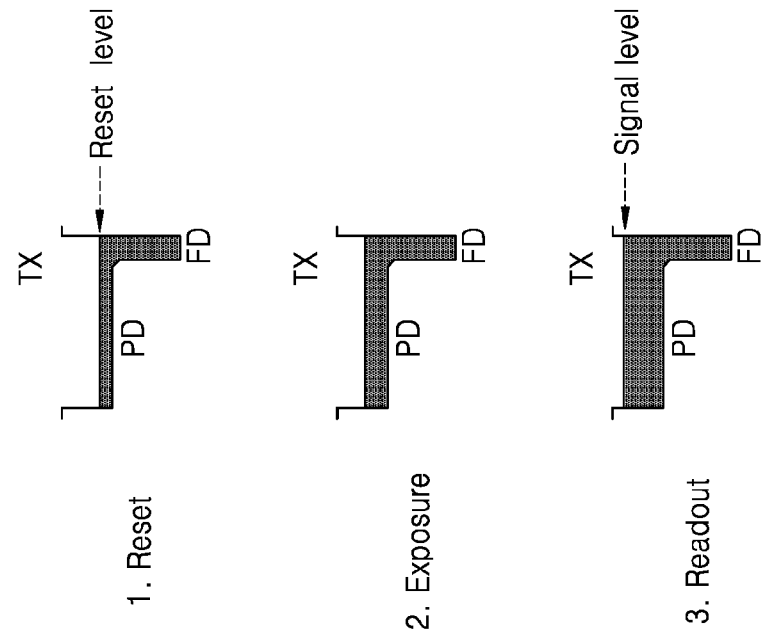
FIGS. 7A and 7B are views illustrating operations of the pixel circuit of one of unit pixels of the pixel array based on operation modes of the image sensor according to an example embodiment.
Figure 7B:
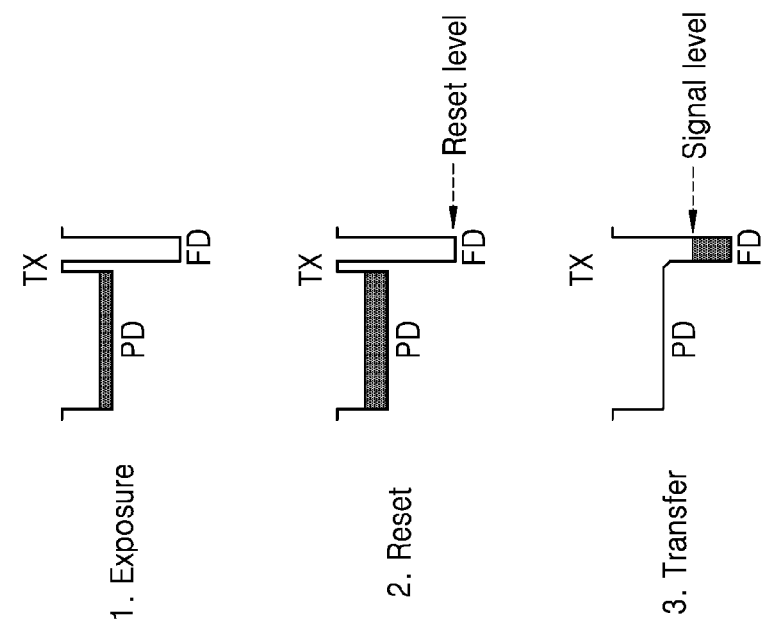

FIGS. 7A and 7B are views illustrating operations of the pixel circuit of one of the unit pixels 1111 of the pixel array 1110 based on the operation mode of the image sensor 1100 according to one example embodiment. In detail, FIG. 7A is a view illustrating operations of the unit pixel 1111 when the operation mode of the image sensor 1100 is the image capture mode. FIG. 7B is a view illustrating operations of the unit pixel 1111 when the operation mode of the image sensor 1100 is the image recognition mode.

FIG. 7A sequentially illustrates operations of the pixel circuit of the unit pixel 1111 for generating an image signal in the image capture mode. In detail, movement of a charge among the photodiode PD, the transfer transistor Tx, and the FD node, and generation of an image signal are illustrated.

As shown in FIG. 7A, in the image capture mode, the pixel circuit of the unit pixel 1111 may generate an image signal through exposure, reset, and transfer operations. First, the reset transistor Rx and the transfer transistor Tx may be turned on. Then, the reset transistor Rx and the transfer transistor Tx may be turned off, and the pixel circuit of the unit pixel 1111 may be exposed to light. At this time, the select transistor Sx may be turned on to read a reset voltage level. Thereafter, the transfer transistor Tx may be turned on to transfer a photocharge generated in the photodiode PD for a predetermined (and/or alternatively, desired) time to the FD node, and a signal voltage level may be read. At this time, the FD node may be reset with a relatively high power voltage (normally about 3.3 V) so as to transfer all the photocharge of the photodiode PD to the FD node, and thus the consumption of power may be increased due to the high power voltage. The difference between the signal voltage level and the reset voltage level may become an image signal of the pixel circuit of the unit pixel 1111 corresponding to the light incident on the pixel circuit of the unit pixel 1111 for the predetermined (and/or alternatively, desired) time.

FIG. 7B sequentially illustrates operations of the pixel circuit of the unit pixel 1111 for generating an image signal in the image recognition mode. In detail, movement of a charge among the photodiode PD, the transfer transistor Tx, and the FD node, and generation of an image signal are illustrated.

As shown in FIG. 7B, in the image recognition mode, the pixel circuit of the unit pixel 1111 may generate an image signal through reset, exposure, and readout operations. Referring to FIG. 7B, in the image recognition mode, the transfer transistor Tx may always be in an ON state. Thus, the photodiode PD and the FD node may be connected to each other. In the image recognition mode, a method of reading the voltage of electrons accumulated in the photodiode PD and the FD node may be used instead of using an electron transfer method by which the pixel circuit of the unit pixel 1111 is operated in the image capture mode. Hereinafter, an explanation will be given of the method of reading the voltage of electrons accumulated in the photodiode PD and the FD node of the pixel circuit of the unit pixel 1111 in the image recognition mode.

Referring to FIG. 7B, a DC voltage of about 3.3 V is applied to the transfer transistor Tx to maintain the transfer transistor Tx in an ON state, and the photodiode PD and the FD node have the same electron potential. At this time, a current does not flow through a gate of the transfer transistor Tx even though the DC voltage of about 3.3 V is applied to the transfer transistor Tx, and thus power consumption at the gate of the transfer transistor Tx may be zero.

First, the reset transistor Rx may set the FD node connected to the photodiode PD to a reset voltage level by using a relatively low power voltage of about 1.5 V or lower. Thereafter, the pixel circuit of the unit pixel 1111 may be exposed to light for a predetermined (and/or alternatively, desired) time. The select transistor Sx may be turned on to read a signal voltage level of the FD node varied by the light. The difference between the signal voltage level and the reset voltage level may become an image signal of the pixel circuit of the unit pixel 1111 corresponding to the light incident on the pixel circuit of the unit pixel 1111 for the predetermined (and/or alternatively, desired) time. Unlike the electron transfer method used in the image capture mode, a high reset voltage is not used to transfer a charge in the image recognition mode, thereby realizing low-voltage resetting, lowering the voltage of the source follower, and making it possible to read image signals even in a voltage drop situation.

With reference to FIGS. 7A and 7B, operations of the pixel circuit of the unit pixel 1111 have been described for the cases in which the operation mode of the image sensor 1100 is the image capture mode and the image recognition mode. Although the electron transfer method is used in the image capture mode, the method of reading the voltage of electrons accumulated in the photodiode PD and the FD node may be used in the image recognition mode. It is noteworthy that the pixel circuit of the unit pixel 1111 is operable in a plurality of manners without having to change the structure of the pixel circuit of the unit pixel 1111. In other words, without having to change the structure of the pixel circuit or add additional circuits, the existing structure of the pixel circuit may be used when the pixel circuit is operated by a relatively low power voltage.

Hereinafter, the structure and operations of the readout circuit 1120 when the operation mode of the image sensor 1100 is the image capture mode and the image recognition mode will be described with reference to FIGS. 8 and 9.

Figure 8:
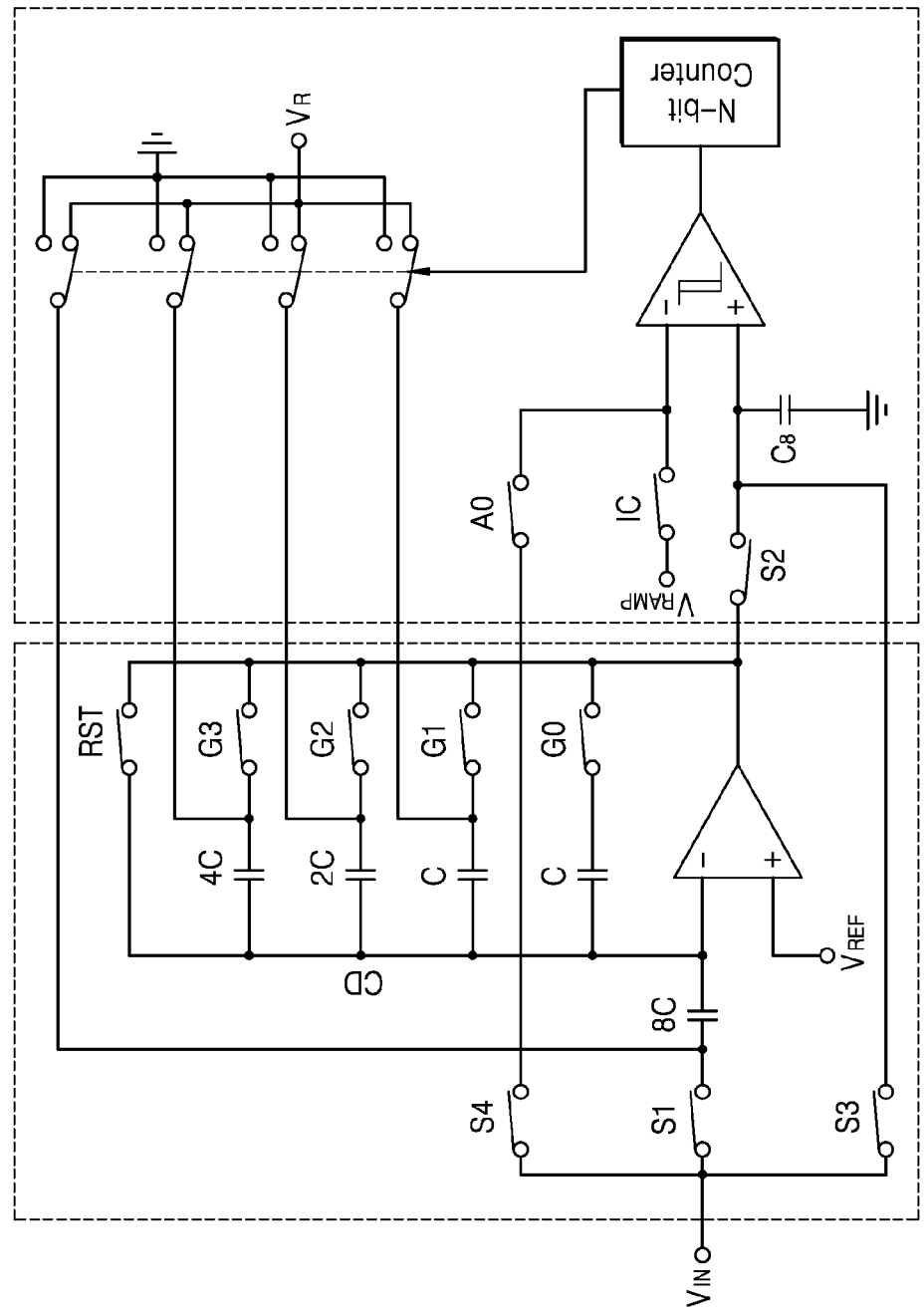
FIG. 8 is a view illustrating a readout circuit of the image sensor according to an example embodiment.

FIG. 8 is a view illustrating the readout circuit 1120 of the image sensor 1100 according to an example embodiment. The readout circuit 1120 may be a column-parallel readout circuit, and FIG. 8 illustrates a circuit of one of the columns of the readout circuit 1120.

The power consumption of ADCs of the readout circuit 1120 accounts for a large portion of the power consumption of the image sensor 1100. Therefore, in the image recognition mode in which a relatively small amount of power is consumed, the readout circuit 1120 may have a structure and operation method different from the structure and operation method that the readout circuit 1120 has in the image capture mode in which a relatively large amount of power is consumed. To this end, additional circuit elements may be minimally added to the structure that the readout circuit 1120 has in the image capture mode, so as to reconfigure the readout circuit 1120 for obtaining images with a small amount of power in the image recognition mode while using the structure of the readout circuit 1120 in the image capture mode and minimally increasing the area of the readout circuit 1120. That is, the readout circuit 1120 may be a reconfigurable readout circuit. Hereinafter, an explanation will be given of the readout circuit 1120 having a structure and operation method reconfigurable according to operation modes.

First, explanations will be given of the structure and operation method of the readout circuit 1120 when the operation mode of the image sensor 1100 is the image capture mode. If the readout circuit 1120 is a column-parallel readout circuit, the circuit of each column of the readout circuit 1120 may include a programmable gain amplifier (PGA) and a single slope analog-digital converter (SS ADC). FIG. 8 illustrates the circuit of each column of the readout circuit 1120, and FIG. 9 illustrates elements of the circuit operating when the operation mode of the image sensor 1100 is the image capture mode. Hereinafter, the structure and operations of the readout circuit 1120 when the operation mode of the image sensor 1100 is the image capture mode will be described in detail with reference to FIG. 9.

Figure 9:
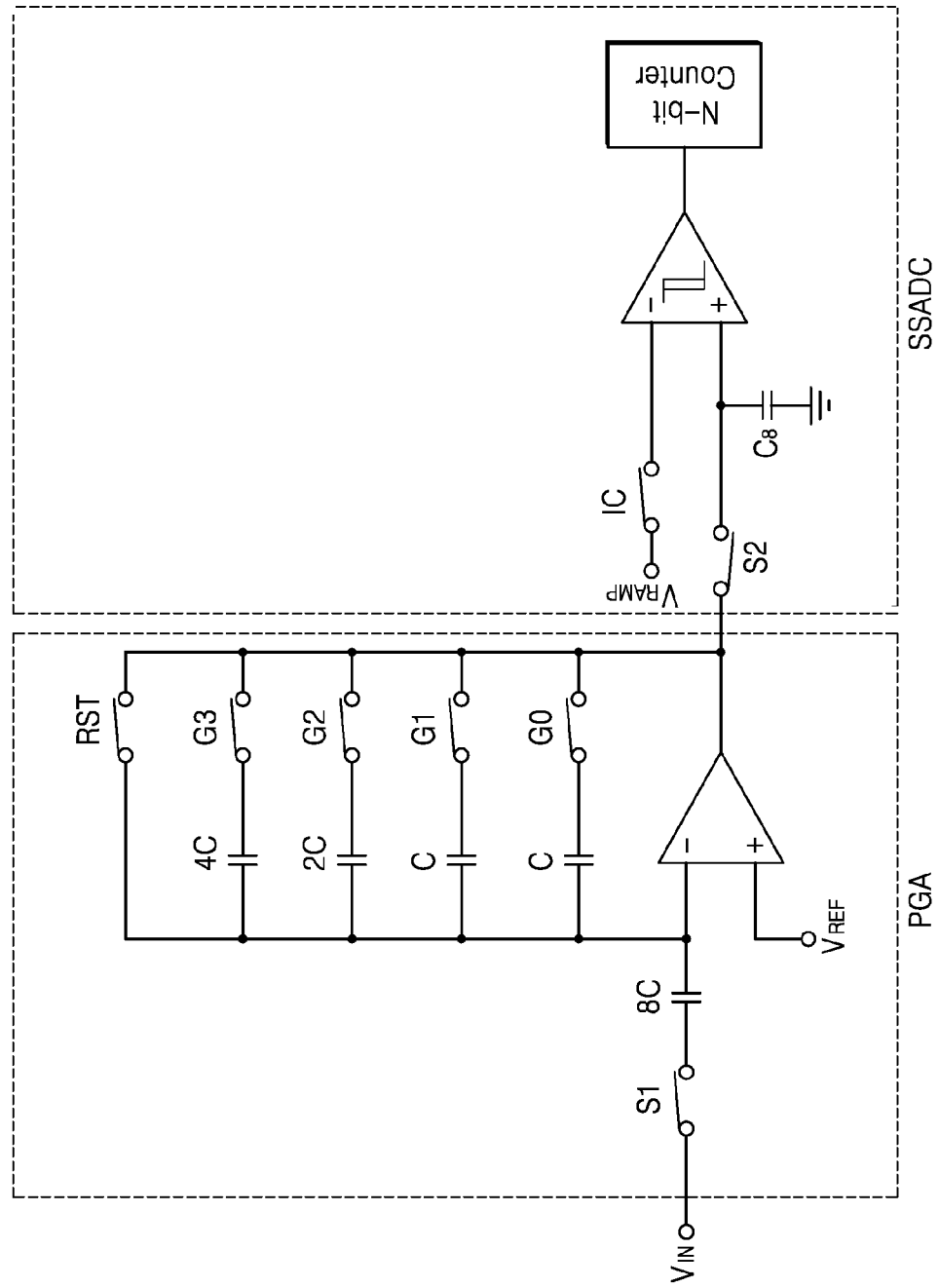
FIG. 9 is a view illustrating elements of the readout circuit of the image sensor that operate when the operation mode of the image sensor is an image capture mode, according to an example embodiment.

FIG. 9 illustrates elements of the readout circuit 1120 of the image sensor 1100 that operate when the operation mode of the image sensor 1100 is the image capture mode, according to an example embodiment.

An image signal generated by the pixel array 1110 is input to the PGA, and an output of the PGA is input to the SS ADC. The PGA may amplify an analog image signal generated by the pixel array 1110.

The PGA may include an amplifier and a capacitor array for defining the gain of the PGA. The capacitor array of the PGA may include capacitors whose capacitance values increase with a ratio of 2. As shown in FIG. 8, the capacitor array may define the gain of the PGA to be 1, 2, 4, or 8 times.

The SS ADC may convert an amplified image signal into a digital signal (analog-digital conversion). The SS ADC may include a sampling capacitor, a comparator, and a counter. The SS ADC may compare a ramp signal having a certain slope and generated by a reference generator (not shown) with the level of an analog image signal generated by each unit pixel 1111 of the pixel array 1110 so as to detect a crossover point at which the ramp signal and the analog image signal intersect. The crossover point may be detected using the comparator of the SS ADC. The crossover point may be converted into a digital value. The counter of SS ADC may be used to determine a digital code value corresponding to the crossover point.

The SS ADC has a high degree of linearity and occupies a small area. However, the conversion time of the SS ADC is long. $2^N$ clock cycles are required for N-bit conversion, and circuit elements operate for a long conversion time, thereby increasing the amount of average current and the consumption of power. In addition, since digital counting from 0 to $2^N$ is necessary, high-frequency switching is performed, and thus a relatively large amount of power is consumed. Therefore, another analog-digital conversion method is required in the image recognition mode for consuming a lower amount of power. Thus, a successive approximation register analog-digital converter (SAR ADC) usable for low power consumption applications may be taken into consideration.

Unlike the SS ADC that counts input ranges while scanning each input range, the SAR ADC may complete a conversion in N cycles by using a binary search algorithm, and thus a high clock frequency may not be necessary. However, the SAR ADC requires a capacitive digital-analog converter including a capacitor array for generating a reference voltage necessary for the binary search algorithm. $2^N C$ capacitors are necessary for N-bit conversion where C denotes a unit capacitance value. A large capacitor or a large number of capacitors require a large area and a large amount of power as well. That is, if the SAR ADC is additionally added for operation in the image recognition mode, since the capacitive digital-analog converter of the SAR ADC occupies a large area, the total area of the readout circuit 1120 may be increased, and the consumption of power may also be increased.

Therefore, instead of using an additional SAR ADC, the PGA and the SS ADC used to obtain high-quality images in the image capture mode are used to form an SAR ADC for low-power-consumption analog-digital conversion in the image recognition mode. A method of realizing an SAR ADC using the PGA and the SS ADC will now be described.

Referring back to FIG. 8, the structure of the readout circuit 1120 shown in FIG. 8 has additional circuit elements compared to the structure of the readout circuit 1120 for the image capture mode shown in FIG. 9. The structure of the readout circuit 1120 shown in FIG. 8 maximally uses the structure of the readout circuit 1120 for the image capture mode shown in FIG. 9 and minimally includes additional circuit elements so that the readout circuit 1120 may be operated with a relatively small amount of power in the image recognition mode.

Referring to FIG. 8, when the operation mode of the image sensor 1100 is the image recognition mode, the circuit of each column of the readout circuit 1120 may be operated as an SAR ADC. An analog image signal generated by the pixel array 1110 may be input to the SAR ADC without amplifying the analog image signal.

The SAR ADC may include a capacitive digital-analog converter, a memory, and a comparator. The SAR ADC of each column of the readout circuit 1120 may be controlled by a single control logic disposed outside the column. The circuit of each column of the readout circuit 1120 may form the SAR ADC when the operation mode of the image sensor 1100 is the image recognition mode, and for this, the circuit may use the PGA and the SS ADC used when the operation mode of the image sensor 1100 is the image capture mode.

In detail, the capacitive digital-analog converter, the memory, the comparator of the SAR ADC may be realized using the capacitor array of the PGA, the counter of the SS ADC, and the comparator of the PGA or the SS ADC, respectively. In other words, the capacitive digital-analog converter of the SAR ADC may be realized using the capacitor array of the PGA. The capacitive digital-analog converter of the SAR ADC is constituted by capacitors whose capacitance values increase with a ratio of 2, and as described above with reference to FIG. 9, the capacitor array of the PGA are also constituted by capacitors whose capacitance values increase with a ratio of 2. If the capacitor array of the PGA and a sampling capacitor of an input end that are shown in FIGS. 8 and 9 are used, a capacitive digital-analog converter for 4-bit analog-digital conversion may be realized. The memory of the SAR ADC may be realized using a memory of the counter of the SS ADC. The comparator of the SAR ADC may be realized using the comparator of the PGA or the SS ADC. As a result, the existing circuit structure may be used without changes or an increase in the area of the circuit structure.

Referring to both FIGS. 8 and 9, the circuit of each column of the readout circuit 1120 may be operated as a first circuit to output a digital image signal by converting an analog image signal when the operation mode of the image sensor 1100 is the image recognition mode, and as a second circuit to output a digital image signal by amplifying an analog image signal and converting the amplified analog image signal when the operation mode of the image sensor 1100 is the image capture mode. The first circuit and the second circuit may share predetermined (and/or alternatively, desired) elements. The circuit of each column of the readout circuit 1120 may be operated as the first circuit by a relatively low power voltage in the image recognition mode and as the second circuit by a relatively high power voltage in the image capture mode. In this case, the first circuit may include the SAR ADC, and the second circuit may include the PGA and the SS ADC.

Figure 10:
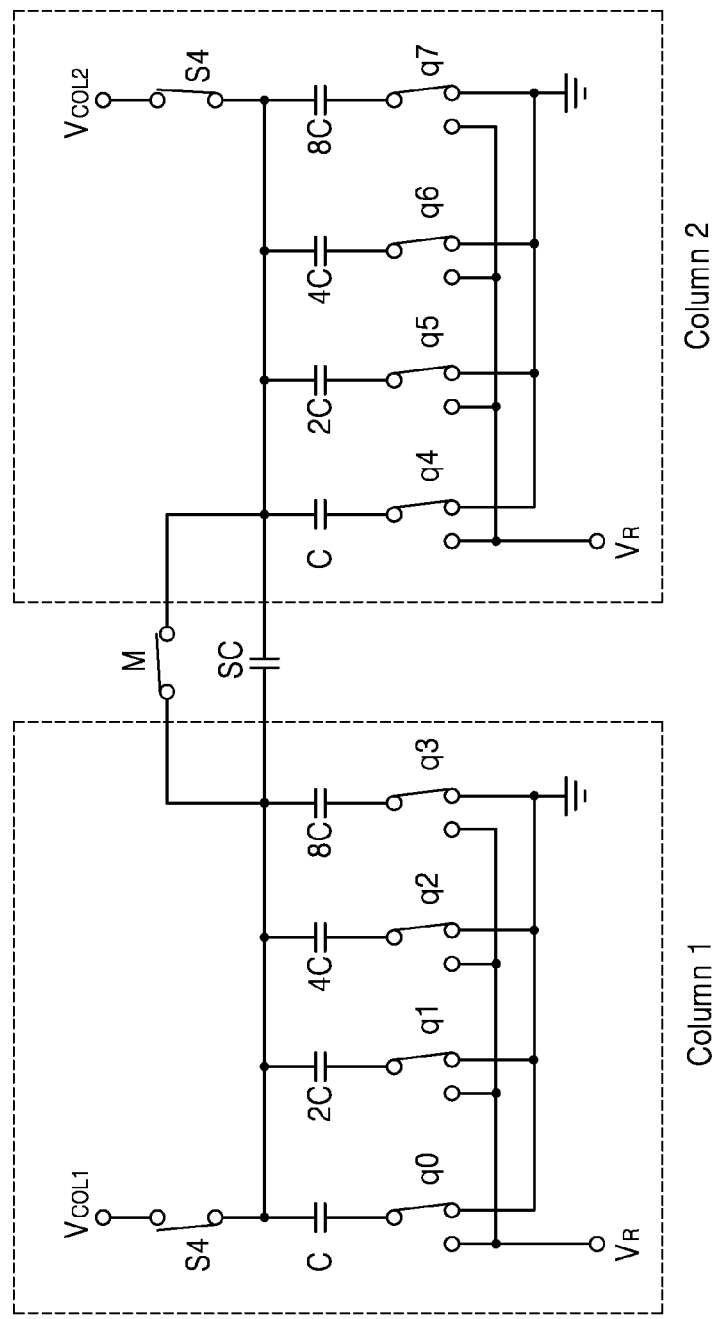
FIG. 10 is a view illustrating a method of realizing a capacitive digital-analog converter by connecting capacitor arrays of columns of the readout circuit according to an example embodiment.

FIG. 10 is a view illustrating a method of realizing a capacitive digital-analog converter by connecting capacitor arrays of columns of the readout circuit 1120 according to one example embodiment.

In the above, a method of realizing a capacitive digital-analog converter using the capacitor array of the PGA in each column of the readout circuit 1120 has been described with reference to FIGS. 8 and 9. However, FIG. 10 illustrates a method of realizing a capacitive digital-analog converter by connecting a capacitor array of a circuit of a column 1 of the readout circuit 1120 to a capacitor array of a circuit of another column 2 of the readout circuit 1120. Referring to FIG. 10, an 8-bit digital-analog converter may be constructed by coupling 4-bit digital-analog converters of columns through a series capacitor SC. In addition, unlike the method shown in FIG. 10, a method of coupling two digital-analog converters via a switch and an additional reference voltage may be used.

A capacitive digital-analog converter may be realized by connecting capacitor arrays respectively included in circuits of at least two neighboring columns of the readout circuit 1120. A 2-shared column-parallel SAR ADC may be realized by connecting capacitor arrays of two neighboring columns to form a capacitive digital-analog converter, and connecting the capacitive digital-analog converter to a single comparator.

FIG. 10 illustrates a 2-shared digital-analog converter (DAC). However, a 4-shared DAC, an 8-shared DAC, or a DAC having more coupled capacitor arrays may be realized. Such a DAC may be connected to an input end of a comparator. If the 2-shared DAC shown in FIG. 10 is used, pixel signals of two columns may be averaged to reduce a horizontal resolution.

Referring to FIG. 10, a method of averaging pixel signals of two columns using a 2-shared DAC is illustrated. A pixel output of Column 1 may be sampled at the left side of the DAC located in Column 1, and at the same time, a pixel output of Column 2 may be sampled at the right side of the DAC located in Column 2. In this case, a charge may be accumulated in the series capacitor SC in an amount corresponding to the potential difference between both ends of the series capacitor SC. Thereafter, if a switch M is turned on, an average value of the pixel outputs of Columns 1 and 2 may be obtained at capacitors of the left and right sides of the DAC. At this time, since the potential difference between both ends of the series capacitor SC becomes zero, the charge accumulated in the series capacitor is zero. In this manner, pixel outputs may be averaged by a single switching operation without additional consumption of power or additional circuit elements so as to decrease a horizontal resolution.

Since high-resolution images are unnecessary in the image recognition mode although high-resolution images are necessary in the image capture mode, if 2×2 pixels are merged to reduce resolution to ¼ of the original value, the circuit of one of the two columns may be deactivated, thereby reducing the consumption of power.

In the above-described example embodiments, the image capturing apparatus 1000 has two operation modes. That is, in the above, the structures and operations of the pixel array 1110 and the readout circuit 1120 of the image sensor 1100 have been described when the image capturing apparatus 1000 has the image recognition mode and the image capture mode. Hereinafter, an explanation will be given of the case in which the image capturing apparatus 1000 has three operation modes.

Figure 11:
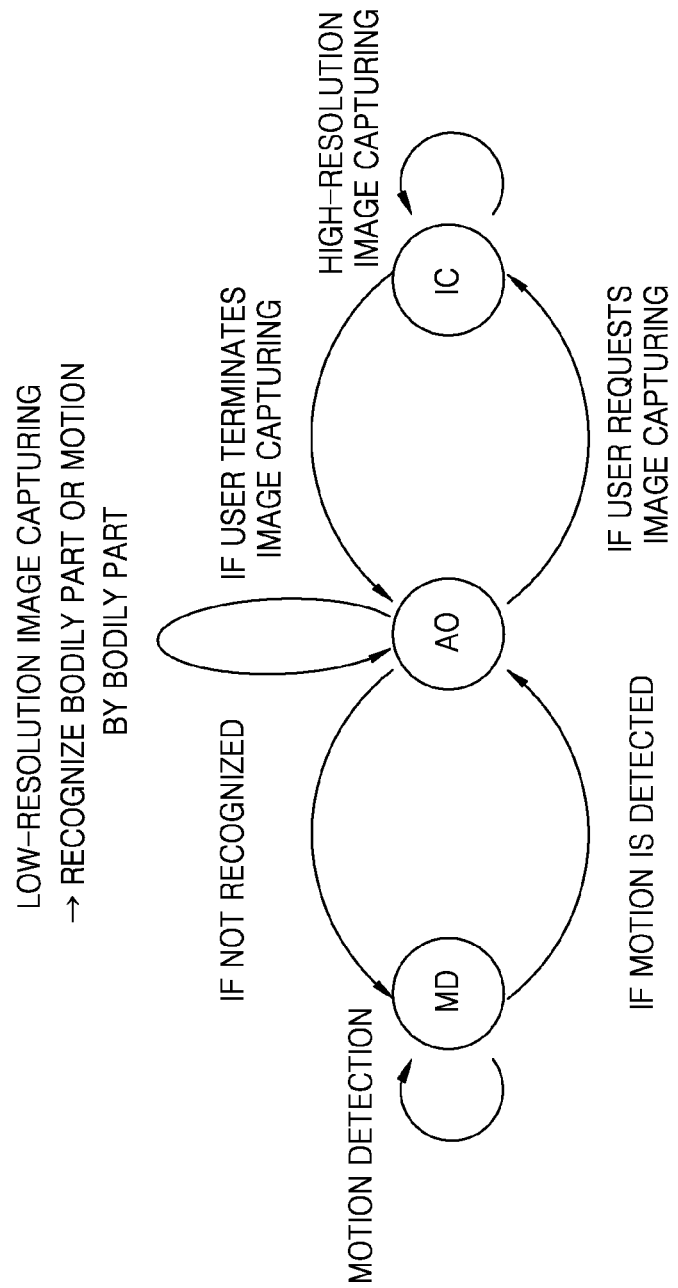
FIG. 11 is a view illustrating a plurality of operation modes of the image capturing apparatus according to another example embodiment.

FIG. 11 is a view illustrating a plurality of operation modes of the image capturing apparatus 1000 according to an example embodiment.

Referring to FIG. 11, the image capturing apparatus 1000 has three operation modes. In detail, the operation mode of the image capturing apparatus 1000 may be a motion detection mode, an image recognition mode, or an image capture mode. When compared to the operation modes described with reference to FIG. 2, the motion detection mode is added. The same descriptions as those given above with reference to FIG. 2 will not be repeated here, and thus the descriptions given above may be applied to current example embodiments even though they are not given here.

In the motion detection mode, motions of a user or the image capturing apparatus 1000 including the image sensor 1100 are detected using a very small amount of power, and if a motion is detected, the image capturing apparatus 1000 may be triggered to operate in the image recognition mode. That is, since power is consumed when an image signal is continuously generated in the image recognition mode the motion detection mode is proposed to reduce the consumption of power. As described above with reference to FIG. 2, the image sensor 1100 and the image capturing apparatus 1000 including the image sensor 1100 may be operated in the image recognition mode for most of the time. Although the consumption of power in the image recognition mode is lower than the consumption of power in the image capture mode, if an image signal is continuously generated for recognizing the body of a user in the image recognition mode, power may be unnecessarily consumed. In the image recognition mode, all the unit pixels 1111 of the pixel array 1110 of the image sensor 1100 are used to continuously generate an image signal for recognizing the body of a user. However, in the motion detection mode, unit pixels 1111 of a predetermined (and/or alternatively, desired) row of the pixel array 1110 of the image sensor 1100 are used to generate an image signal for detecting motions, thereby reducing the consumption of power compared to the consumption of power in the image recognition mode. Here, the predetermined (and/or alternatively, desired) row may be a middle row of rows of the pixel array 1110 or a row selected by a user.

As described above with reference to FIG. 2, in the image recognition mode, the body of a user may be recognized from low-quality or low-resolution images obtained with a relatively small amount of power, and in the image capture mode, a user may capture high-quality or high-resolution images using a relatively large amount of power.

Referring to FIG. 11, the image recognition mode is illustrated in a center region, and the motion detection mode and the image capture mode are illustrated on the left and right sides of the image recognition mode.

If a user requests image capturing in the image recognition mode, the operation mode of the image capturing apparatus 1000 may be changed from the image recognition mode to the image capture mode. Then, the user may capture high-resolution images in the image capture mode. If the user terminates image capturing in the image capture mode, the operation mode of the image capturing apparatus 1000 may be changed from the image capture mode to the image recognition mode. In the image recognition mode, the image capturing apparatus 1000 may capture low-resolution images with a relatively small amount of power and may recognize a bodily part of the user or a motion made by a bodily part of the user by using the captured low-resolution images.

If the shape of a bodily part or a motion of the user is not recognized for a predetermined (and/or alternatively, desired) time period or a predetermined (and/or alternatively, desired) number of times, the operation mode of the image capturing apparatus 1000 may be changed from the image recognition mode to the motion detection mode. In the motion detection mode, the image capturing apparatus 1000 may detect motions made by itself or a user. If the image capturing apparatus 1000 or a user moves, image signals of the unit pixels 1111 of the pixel array 1110 may be varied. In this case, the image capturing apparatus 1000 may detect the motion based on an image signal generated by unit pixels 1111 of a predetermined (and/or alternatively, desired) row of the pixel array 1110 instead of using the image signals generated by all the unit pixels 1111. Furthermore, if the image capturing apparatus 1000 detects a motion made by itself or a user in the motion detection mode, the operation mode of the image capturing apparatus 1000 may be changed from the motion detection mode to the image recognition mode.

Hereinafter, transition from the motion detection mode to the image recognition mode will be described in detail.

Figure 12:
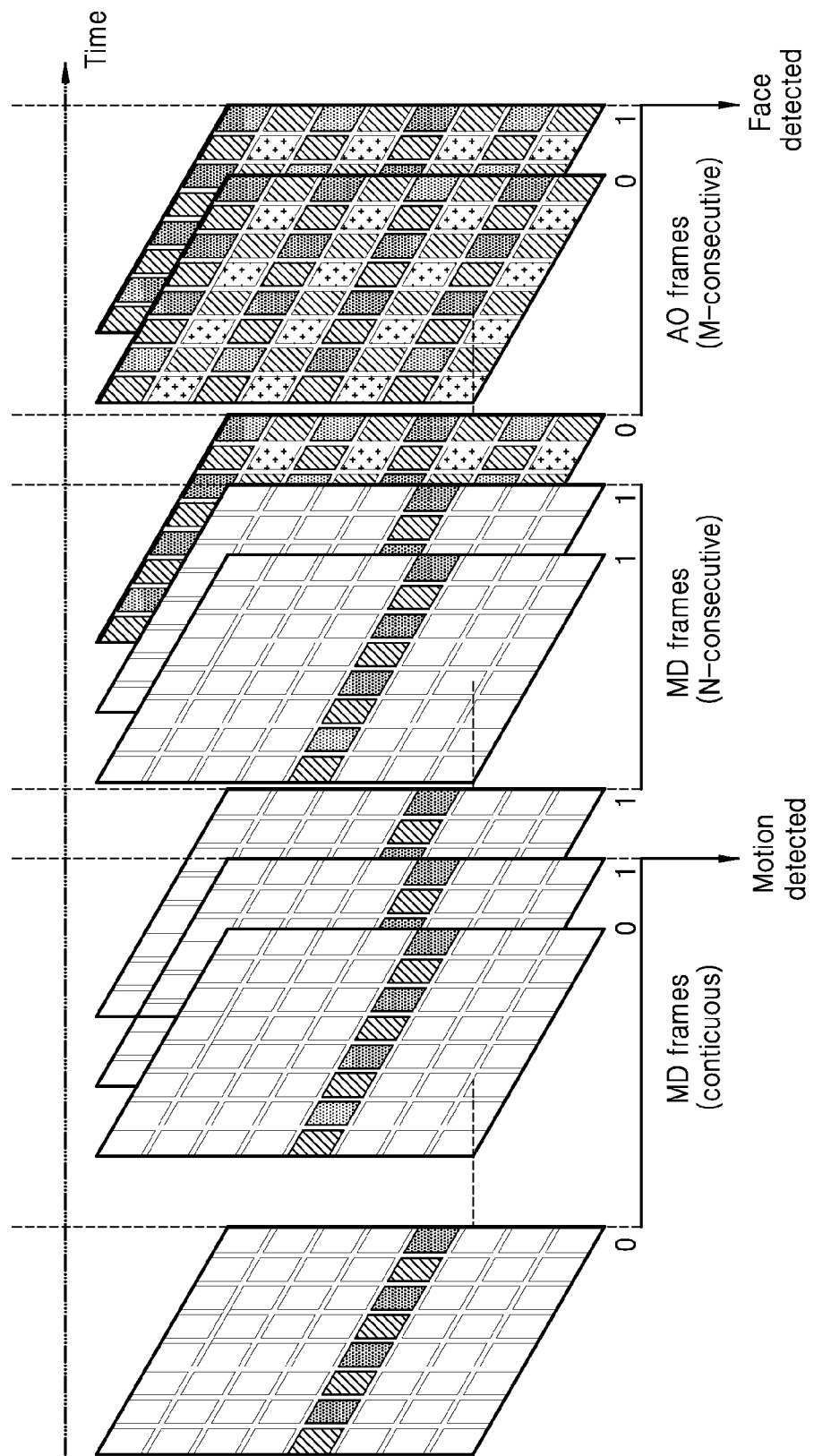
FIG. 12 is a view illustrating transition from a motion detection mode to an image recognition mode according to an example embodiment.

FIG. 12 is a view illustrating transition from the motion detection mode to the image capture mode according to an example embodiment.

As described above with reference to FIG. 11, the image capturing apparatus 1000 may read out an image signal generated by unit pixels 1111 of a predetermined (and/or alternatively, desired) row of the pixel array 1110 so as to detect motions made by itself or a user. If values of the unit pixels 1111 of the predetermined (and/or alternatively, desired) row of the pixel array 1110 of the image sensor 1100 are varied, it may be determined that the image capturing apparatus 1000 or the user moves. However, when a motion continuously made for a predetermined (and/or alternatively, desired) period of time rather than a motion made for a short moment (variations of values for a short moment) is detected, the image capturing apparatus 1000 may switch from the motion detection mode to the image recognition mode.

As shown in FIG. 12, the image capturing apparatus 1000 may operate the unit pixels 1111 of the predetermined (and/or alternatively, desired) row together with a line sensor so as to detect a motion from motion detection (MD) frames. In other words, the image capturing apparatus 1000 may measure the difference between an image signal of the current frame corresponding to the unit pixels 1111 of the predetermined (and/or alternatively, desired) row and an image signal of the previous frame corresponding to the unit pixels 1111 of the predetermined (and/or alternatively, desired) row, so as to detect a motion. If a motion is continuously detected from a predetermined (and/or alternatively, desired) number N of frames after motion detection started, the image capturing apparatus 1000 may be triggered to operate in the image recognition mode.

In the image recognition mode, the image capturing apparatus 1000 may recognize the body of a user using a predetermined (and/or alternatively, desired) number M of frames. As shown in FIG. 12, in the image recognition mode, the image capturing apparatus 1000 may recognize the face or hand of a user or the eyes or gestures of a user by using M images obtained with a relatively small amount of power. However, if the body of a user is not recognized in the image recognition mode, the operation mode of the image capturing apparatus 1000 may be changed back to the motion detection mode to detect a motion.

Hereinafter, the image capturing apparatus 1000 including the image sensor 1100 will be described in detail for the case in which the image capturing apparatus 1000 has the three operation modes: the motion detection mode, the image recognition mode, and the image capture mode.

Figure 13:
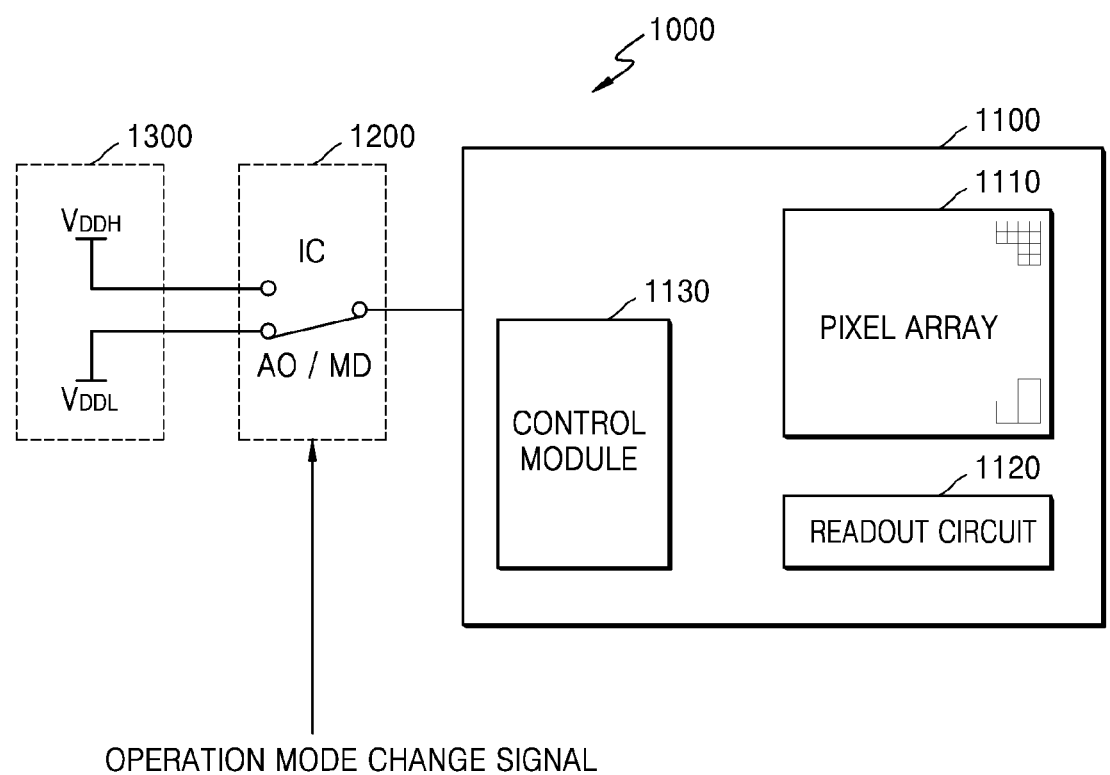
FIG. 13 is a view illustrating operations of the image capturing apparatus according to the other example embodiment.

FIG. 13 is a view illustrating operations of the image capturing apparatus 1000 according to an example embodiment.

Referring to FIG. 13, the power change unit 1200 may be disposed between the image sensor 1100 and the power supply 1300. According to an operation mode change signal input from the control unit 1400, the power change unit 1200 may select one of a plurality of power voltages generated by the power supply unit 1300.

For example, if the control unit 1400 determines the image recognition mode as the operation mode of the image sensor 1100, an operation mode change signal indicating that the operation mode of the image sensor 1100 is the image recognition mode may be sent from the control unit 1400 to the power change unit 1200. Then, the power change unit 1200 may change or maintain its circuit connection based on the received operation mode change signal so as to select a power voltage corresponding to the image recognition mode from the plurality of power voltages generated by the power supply unit 1300 (hereinafter, the selected power voltage may be referred to as a "first power voltage").

In addition, if the control unit 1400 determines the image capture mode as the operation mode of the image sensor 1100, an operation mode change signal indicating that the operation mode of the image sensor 1100 is the image capture mode may be sent from the control unit 1400 to the power change unit 1200. Then, the power change unit 1200 may change or maintain its circuit connection based on the received operation mode change signal so as to select a power voltage corresponding to the image capture mode from the plurality of power voltages generated by the power supply unit 1300 (hereinafter, the selected power voltage may be referred to as a "second power voltage").

In addition, if the control unit 1400 determines the motion detection mode as the operation mode of the image sensor 1100, an operation mode change signal indicating that the operation mode of the image sensor 1100 is the motion detection mode may be sent from the control unit 1400 to the power change unit 1200. Then, the power change unit 1200 may change or maintain its circuit connection based on the received operation mode change signal so as to select a power voltage corresponding to the motion detection mode from the plurality of power voltages generated by the power supply unit 1300 (hereinafter, the selected power voltage may be referred to as a "third power voltage").

If the power change unit 1200 includes a switching device as shown in FIG. 13, the switching device may be switched according to an operation mode change signal input from the control unit 1400. For example, if the control unit 1400 determines the motion detection mode or the image recognition mode as the operation mode of the image sensor 1100, the power change unit 1200 may switch the switching device so that a relatively low power voltage $V_{DDL}$ of the power voltages generated by the power supply unit 1300 may be applied to the image sensor 1100. On the other hand, if the control unit 1400 determines the image capture mode as the operation mode of the image sensor 1100, the power change unit 1200 may switch the switching device so that a relatively high power voltage $V_{DDH}$ of the power voltages generated by the power supply unit 1300 may be applied to the image sensor 1100.

That is, the first power voltage used to drive the image sensor 1100 for recognizing the body of a user in the motion detection mode may be lower than the second power voltage used to drive the image sensor 1100 in the image capture mode in which a user captures images, and may be equal to the third power voltage used to drive the image sensor 1100 for detecting motions of the user or the image capturing apparatus 1000 including the image sensor 1100 in the motion detection mode. In other words, the first power voltage and the third power voltage may be equal to each other and may be lower than the second power voltage.

The image sensor 1100 may include the pixel array 1110, the readout circuit 1120, and the control module 1130. Those of ordinary skill in the art may easily understand that the image sensor 1100 may further include other general-use elements in addition to the elements illustrated in FIG. 13.

The pixel array 1110 may include the unit pixels 1111 configured to convert incident light into an analog image signal. The method of converting incident light into an analog image signal using the pixel array 1110 or the number of unit pixels 1111 of the pixel array 1110 used to convert incident light into an analog image signal may be varied according to the operation mode of the image sensor 1100 determined by the control unit 1400. The control module 1130 may generate a control signal so as to control operations of the pixel array 1110 based on the operation mode of the image sensor 1100 determined by the control unit 1400.

The pixel array 1110 operates in the image recognition mode and the image capture mode as described with reference to FIGS. 6, 7A, and 7B. The pixel array 1110 operates in the motion detection mode as described with reference to FIG. 12. That is, in the image recognition mode, the pixel circuit of each unit pixel 1111 of the pixel array 1110 may be operated by a method of maintaining the transfer transistor Tx in an ON state all the time and reading the voltage of electrons accumulated in the photodiode PD and the FD node. In the image capture mode, the pixel circuit of each pixel of the pixel array 1110 may be operated by a method of turning on/off the transfer transistor Tx to transfer electrons from the photodiode PD to the FD node. In the motion detection mode, the pixel circuit of each unit pixel of the pixel array 1110 may be operated as in the image recognition mode by a method of maintaining the transfer transistor Tx in an ON state all the time and reading the voltage of electrons accumulated in the photodiode PD and the FD node. However, in the motion detection mode, only unit pixels of a predetermined (and/or alternatively, desired) row of the pixel array 1110 may be operated.

The readout circuit 1120 may output a digital image signal by converting an analog image signal generated by the pixel array 1110. The readout circuit 1120 may convert the analog image signal into the digital image signal by different methods according to the operation mode of the image sensor 1100 determined by the control unit 1400. In other words, the control module 1130 may generate a control signal so as to control operations of the readout circuit 1120 based on the operation mode of the image sensor 1120 determined by the control unit 1400.

The readout circuit 1120 operates in the image recognition mode and the image capture mode as described with reference to FIGS. 8 and 9. Hereinafter, operations of the readout circuit 1120 in the motion detection mode will be described.

Figure 14:
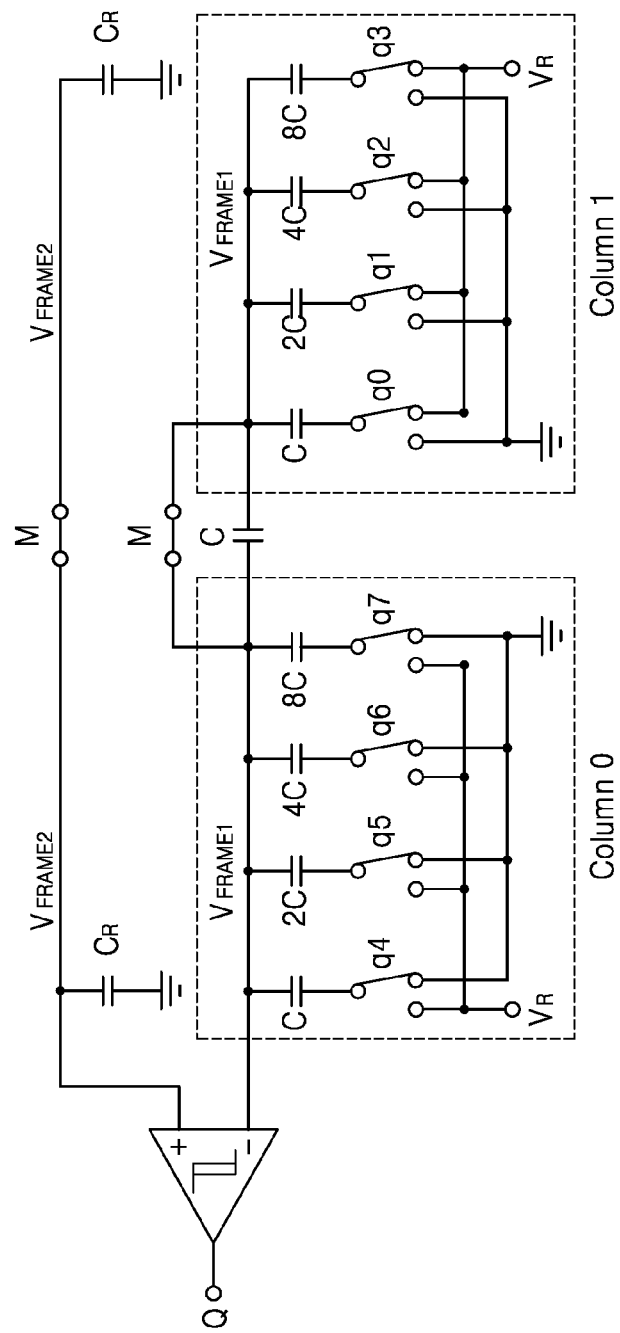
FIG. 14 is a view illustrating a circuit structure for detecting motions in the motion detection mode according to an example embodiment.

FIG. 14 is a view illustrating a circuit structure for detecting motions in the motion detection mode according to an example embodiment.

As shown in FIG. 12, in the motion detection mode, the image capturing apparatus 1000 may operate the unit pixels 1111 of the predetermined (and/or alternatively, desired) row together with the line sensor so as to detect a motion. In other words, the image capturing apparatus 1000 may measure the difference between an image signal of the current frame corresponding to the unit pixels 1111 of the predetermined (and/or alternatively, desired) row and an image signal of the previous frame corresponding to the unit pixels 1111 of the predetermined (and/or alternatively, desired) row, so as to detect a motion. At this time, the readout circuit 1120 may detect a motion in the motion detection mode by connecting circuits of every two neighboring columns of the readout circuit 1120 to determine whether a difference signal between two frames is greater than a predetermined (and/or alternatively, desired) value by a winner-take-all (WTA) readout method, and thus frequencies and power may be saved.

FIG. 14 illustrates circuits of columns constituting the readout circuit 1120 in the motion detection mode, according to an example embodiment. In detail, a capacitive digital-analog converter may sample an image signal $V_{FRAME1}$ obtained from the previous frame, and capacitors $C_R$ may sample an image signal $V_{FRAME2}$ obtained from the current frame. Two columns 0 and 1 may be grouped as a unit and a difference signal between two frames may be checked by sampling image signals from the two columns 0 and 1 and then turning on switches M to average the image signals of the two columns 0 and 1. To detect a motion, the switches M may be maintained in an ON state until an image signal of the next frame is sampled. As shown in FIG. 14, switches q4, q5, q6, and q7 of the column 0 may be connected to ground, and switches q0, q1, q2, and q3 of the column 1 may be connected to a reference voltage $V_R$.

The circuit of each column of the readout circuit 1120 may output a digital signal indicating whether a motion is detected or not by sampling an image signal of the current frame and an image signal of the previous frame of the unit pixels of the predetermined row, and checking a difference signal between the sampled two image signals. Specifically, in the motion detection mode, if a difference signal $V_{DIFF}$ ($|V_{FRAME1}-V_{FRAME2}|$) between sampled image signals is greater than a preset voltage $V_{TH}$, the readout circuit 1120 may determine that a motion is detected. The sensitivity of motion detection may be determined by the preset voltage $V_{TH}$. The preset voltage $V_{TH}$ may be adjusted using the capacitive digital-analog converter. The preset voltage $V_{TH}$ may be adjusted to have a positive (+) value or a negative (−) value according to operations of the switches of the capacitive digital-analog converter. For example, if the switches q5 and q6 are turned on, the preset voltage $V_{TH}$ may be +6/30, and if the switches q1 and q2 are turned on, the preset voltage $V_{TH}$ may be −6/30. Since the capacitive digital-analog converter has a total capacitance value of 30 C, the absolute value of the preset voltage $V_{TH}$ is determined by the ratio of a capacitance value determined by the positions of the switches to the total capacitance value. Hereinafter, operations of the readout circuit 1120 and detection of a motion in the motion detection mode will be described.

Figure 15:
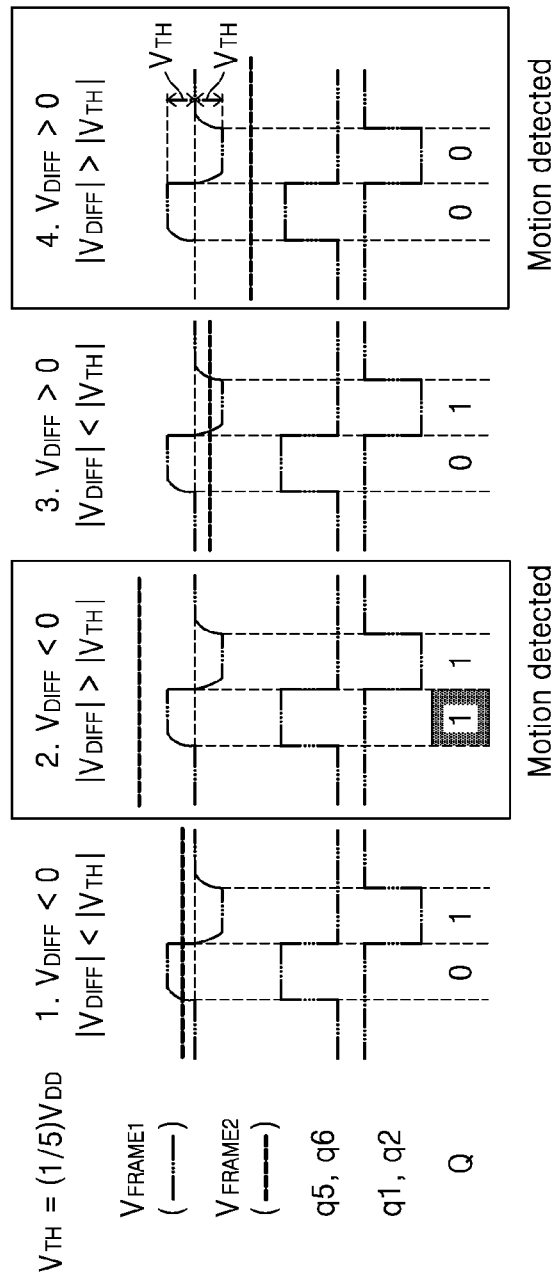
FIG. 15 is a view illustrating operations of the circuit structure for detecting motions in the motion detection mode and a situation in which a motion is detected according to an example embodiment.

FIG. 15 is a view illustrating operations of the circuit structure for detecting motions in the motion detection mode and a situation in which a motion is detected according to an example embodiment.

Referring to FIG. 15, the operation of the readout circuit 1120 and how a motion is detected are illustrated according to four conditions. The switches of the capacitive digital-analog converter of the readout circuit 1120 explained with reference to FIG. 14 may be controlled so as to cause fluctuations in an image signal $V_{FRAME1}$ obtained from the previous frame in an upward or downward direction by the absolute value of a preset voltage $V_{TH}$. After the image signal $V_{FRAME1}$ obtained from the previous frame is changed by the absolute value of the preset voltage $V_{TH}$, the image signal $V_{FRAME1}$ is compared with an image signal $V_{FRAME2}$ obtained from the current frame, and if a difference signal $V_{DIFF}$ between the image signals $V_{FRAME1}$ and $V_{FRAME2}$ satisfies $|V_{DIFF}|>|V_{TH}|$, it is determined that a motion is detected.

In FIG. 15, Q refers to the output of a comparator of the readout circuit 1120 shown in FIG. 14 in the case in which the image signal $V_{FRAME1}$ obtained from the previous frame fluctuates upward or downward by the absolute value of the preset voltage $V_{TH}$, and in each case, a resultant 2-bit digital signal may be stored in a latch.

As shown in FIG. 15, when the 2-bit digital signal has a value of '11' or '00,' it may be determined that a motion is detected. In the two cases, only when the value Q of a high order bit is 1, that is, the 2-bit digital signal has a value of '11,' it may be determined that a motion is made, so as to markedly reduce the consumption of power necessary for reading out digital signals. In this respect, a method of reading out a digital signal in the image recognition mode and the motion detection mode will be described with reference to FIGS. 16A and 16B.

Figure 16A:
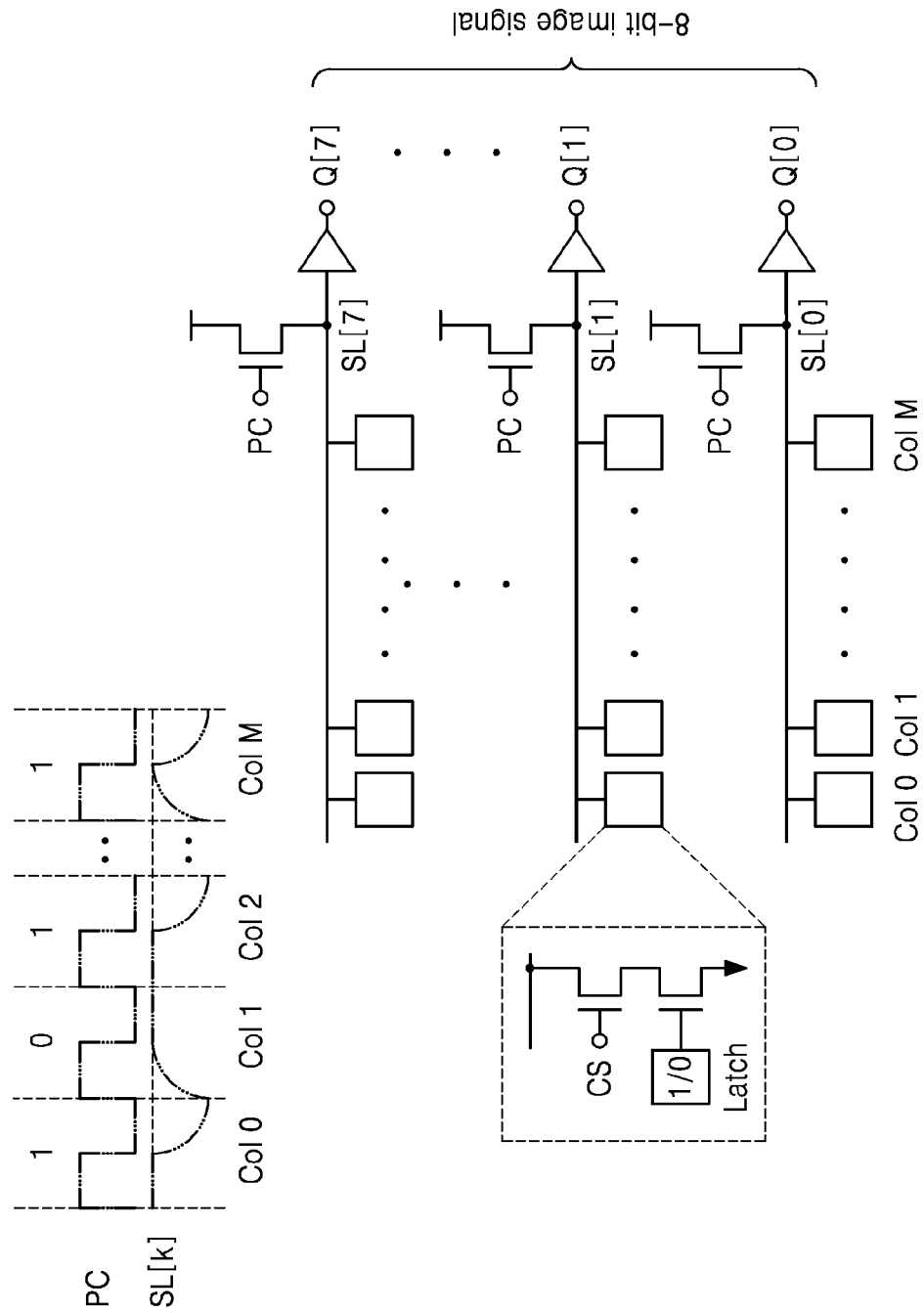
FIGS. 16A and 16B are views illustrating readout methods in the image recognition mode and the motion detection mode according to an example embodiment.

FIG. 16A illustrates a method of reading out a digital image signal in the image recognition mode according to an example embodiment. In the image recognition mode, since a digital image signal is an 8-bit signal, there are eight sense lines SL[0] to SL[7], and latches of columns having the same bit position are connected to the same sense line SL. In the image recognition mode, a digital image signal may be read out by a method described below.

Referring to FIG. 16A, a transistor PC connected to each sense line SL may be turned on so as to precharge each sense line SL with a power voltage, that is, a first power voltage, the image recognition mode. In a process of reading out an image signal sequentially from columns, a column may be selected by turning on transistors CS of the column. In this case, if a digital image signal stored in a latch is '0,' the voltage of a corresponding precharged sense line may be maintained, and if the digital image signal stored in the latch is '1,' the voltage of the corresponding precharged sense line SL may be discharged. This operation may be sequentially performed on all the columns to read out a digital image signal. However, since the sense lines SL are long metal lines, the sense lines SL have a high degree of parasitic capacitance. In addition, a high-frequency signal is necessary for the transistor PC to perform the above-described process on all the columns within a short period of time. Therefore, the consumption of power may be increased.

Figure 16B:
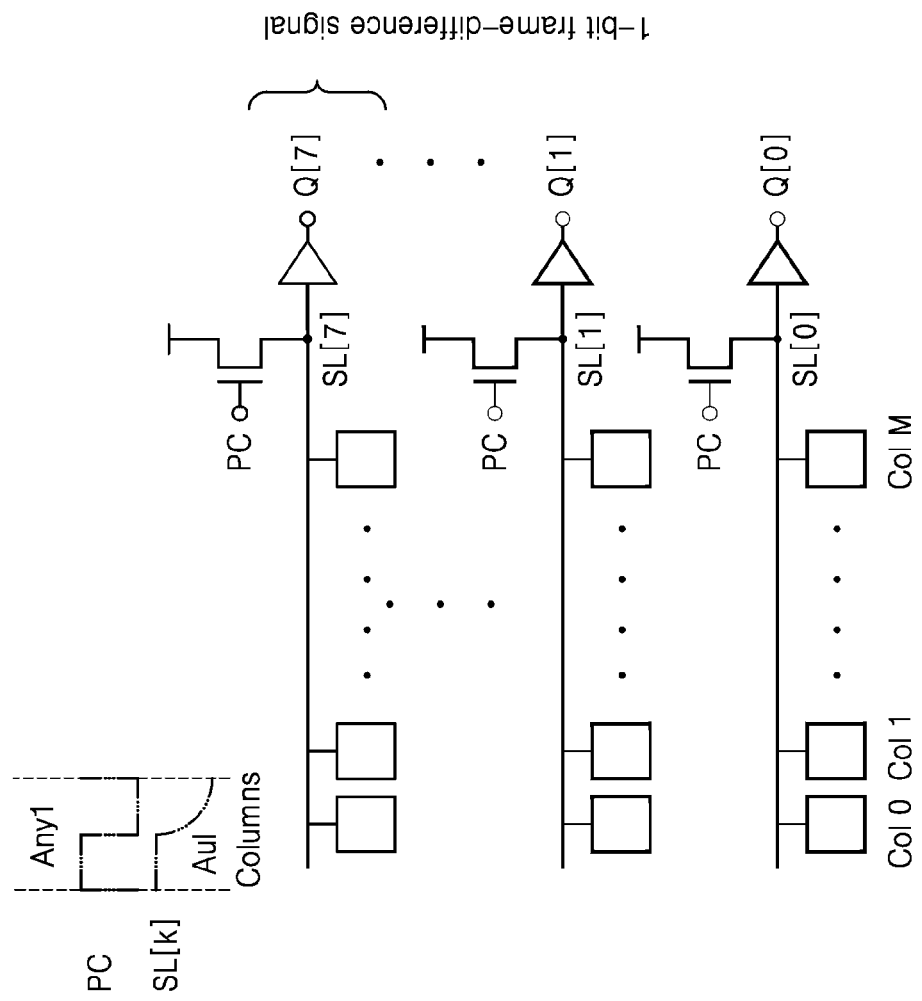

FIG. 16B illustrates a method of reading out a digital image signal in the motion detection mode according to an example embodiment. The purpose of the motion detection mode is not image capturing but motion detection. Thus, as shown in FIG. 16B, whether there is a latch storing '1' may only be determined using a relatively small amount of power by a WTA method. In the motion detection mode, a digital image signal may be read out by a method described below.

As described above with reference to FIG. 15, only when the output Q of the comparator is a 2-bit digital signal having a value of '11,' it may be assumed that a motion is detected. In this case, the value of a high order bit of the output Q of the comparator may be stored in latches connected to the sense line SL[7], and if '1' is stored in any one of the latches, it may be determined that a motion is detected. In other words, the readout circuit 1120 may detect a motion as follows. The readout circuit 1120 may precharge a line connecting latches, in which digital signals output from circuits of columns are respectively stored, with a third power voltage. Then, when digital signals stored in the latches are simultaneously read, the readout circuit 1120 may detect a motion based on whether the precharged line is discharged.

Referring to FIG. 16B, a transistor PC connected to the sense line SL[7] may be turned on so as to precharge the sense line SL[7] with a power voltage, that is, the third power voltage, in the image recognition mode. When the transistors CS of all the columns are simultaneously turned on to select all the columns and read out digital signals from all the columns, if all digital signals stored in latches are '0,' the voltage of the precharged sense line SL[7] may be maintained. However, if there is one or more latches storing '1,' the voltage of the precharged sense line SL[7] may be discharged. If the voltage of the sense line SL[7] is maintained, it may be determined that a motion is not detected, and if the voltage of the sense line SL[7] is discharged, it may be determined that a motion is detected. In this manner, a difference signal between frames may be checked, and thus a motion may be detected with a relatively small amount of power.

In other words, a difference signal between the current frame and the previous frame of the unit pixels of a predetermined (and/or alternatively, desired) row of the pixel array 1110 may be compared with a predetermined (and/or alternatively, desired) critical value in units of a predetermined (and/or alternatively, desired) number of columns, and a digital signal indicating results of the comparison may be stored in units of the predetermined number of columns. In this case, if a digital signal indicating detection of a motion is stored in any latch, it may be determined that a motion is detected.

Figure 17:
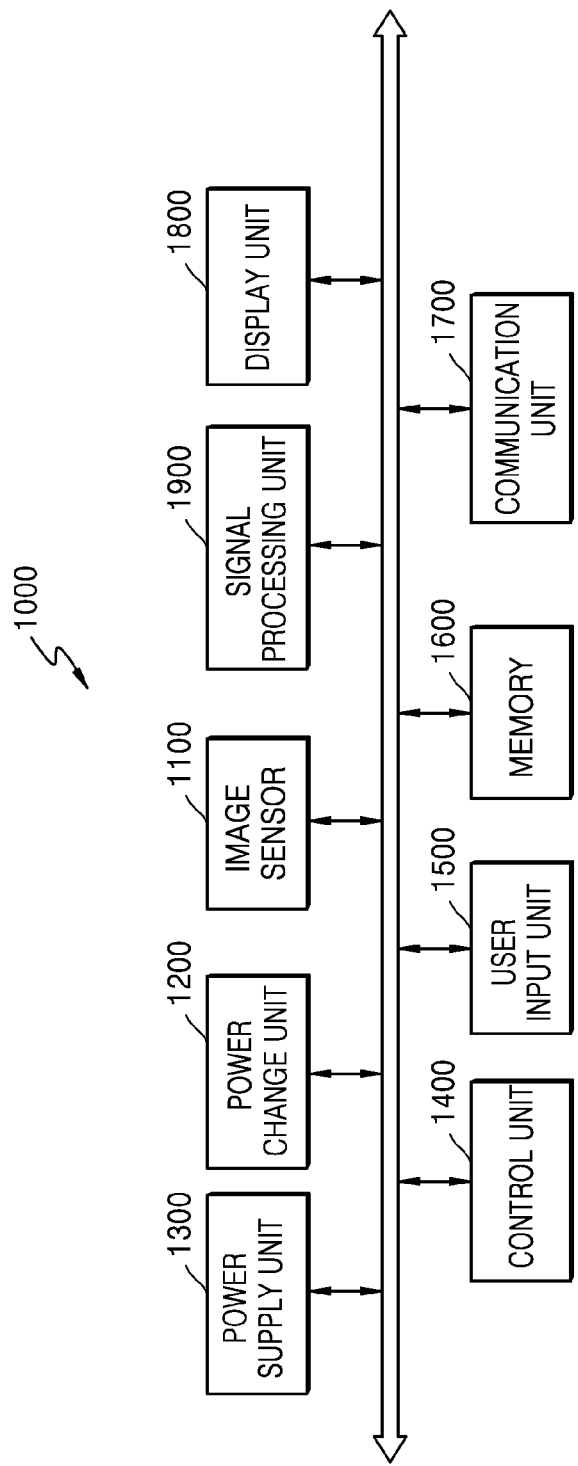
FIG. 17 is a block diagram illustrating an image capturing apparatus according to another example embodiment.

FIG. 17 is a block diagram illustrating an image capturing apparatus 1000 according to an example embodiment. Those having ordinary skill in the art may easily understand that the unit pixel 1111 may further include other general-use elements in addition to elements illustrated in FIG. 17. For the sake of brevity, elements in FIG. 17 that were described above with reference to FIG. 1, will not be described in greater detail.

Referring to FIG. 17, the image capturing apparatus 1000 may include an image sensor 1100, a power change unit 1200, a power supply unit 1300, a control unit 1400, a user input unit 1500, a memory 1600, a communication unit 1700, a display unit 1800, and a signal processing unit 1900.

The image sensor 1100 may output an image signal by converting incident light. The image sensor 1100 may operate in a plurality of operation modes by different methods. Different power voltages may be applied to the image sensor 1100 according to the operation mode of the image sensor 1100, and accordingly the power consumption of the image sensor 1100 may be varied. According to the operation mode of the image sensor 1100, an image signal corresponding to all unit pixels of a pixel array 1110 of the image sensor 1100 may be output, or an image signal corresponding to unit pixels of a predetermined (and/or alternatively, desired) row of the pixel array 1110 of the image sensor 1100 may be output.

The power supply unit 1300 may provide different power voltages. Since the image sensor 1100 is operated by different power voltages in different manners according to operation modes, the power supply unit 1300 may provide two or more power voltages.

The control unit 1400 may determine one of a plurality of operation modes as the operation mode of the image sensor 1100. For example, the control unit 1400 may select one of an image recognition mode in which the body of a user is recognized or an image capture mode in which the user captures images and may determine the selected operation mode as the operation mode of the image sensor 1100. In another example embodiment, the control unit 1400 may select one of the image recognition mode, the image capture mode, and a motion detection mode in which motions of a user or the image capturing apparatus 1000 including the image sensor 1100 are detected, and may determine the selected operation mode as the operation mode of the image sensor 1100. For example, if a user inputs an image capturing request in the image recognition mode, the control unit 1400 may determine the image capture mode as the operation mode of the image sensor 1100, and if the body of the user is not recognized for a predetermined (and/or alternatively, desired) period of time in the image recognition mode, the control unit 1400 may change the operation mode of the image sensor 1100 from the image recognition mode to the motion detection mode. The image sensor 1100 may be operated by different methods according to the operation mode determined by the control unit 1400.

In addition, the control unit 1400 may display some of the information stored in the memory 1600 on the display unit 1800. In addition, if a user touches a region of the display unit 1800, the control unit 1400 may perform a control operation according to the touch of the user.

Although not shown, the control unit 1400 may include one or more of a random access memory (RAM), a read only memory (ROM), a central processing unit (CPU), a graphic processing unit (GPU), and data buses. The RAM, ROM, CPU, and GPU may be connected to each other through the data buses.

The power change unit 1200 may apply a power voltage corresponding to the determined operation mode, to the image sensor 1100 from the power supply unit 1300. A first power voltage to be applied to the image sensor 1100 when the operation mode determined by the control unit 1400 is the image recognition mode, may be lower than a second power voltage to be applied to the image sensor 1100 when the determined operation mode is the image capture mode.

The user input unit 1500 may receive user manipulations. The user input unit 1500 may receive various instructions from a user. The user input unit 1500 may include one or more of a keypad, a touch panel, and a pen recognition panel.

The memory 1600 may store various programs, contents, and data necessary for operations of the image capturing apparatus 1000.

The communication unit 1700 may communicate with various external devices by various communication methods. The communication unit 1700 may include one or more of a WiFi chip, a Bluetooth chip, a near field communication (NFC) chip, and a wireless communication chip. The control unit 1400 may communicate with various external devices through the communication unit 1700.

The display unit 1800 may include a display panel and a controller controlling the display panel. The display panel may include a display such as a liquid crystal display (LCD), an organic light emitting diode (OLED) display, an active-matrix organic light emitting diode (AM-OLED) display, or a plasma display panel (PDP). The display panel may be flexible, transparent, or wearable. The display unit 1800 may be combined with the touch panel of the user input unit 1500 so as to provide a touch screen. For example, the touch screen may include a module in which a display panel and a touch panel are combined in a stacked structure.

The signal processing unit 1900 may process an input image signal. The signal processing unit 1900 may receive an image signal from the image sensor 1100 and process the image signal according to the purpose of use of the image signal. For example, if the operation mode of the image sensor 1100 is the image recognition mode, the signal processing unit 1900 may receive a low-quality, low-resolution image signal from the image sensor 1100 and may process the image signal for motion vector estimation, feature extraction, object detection, or the like. In another example embodiment, if the operation mode of the image sensor 1100 is the image capture mode, the signal processing unit 1900 may receive a high-quality, high-resolution image signal and may process the image signal to improve the quality of the image signal by luminance level adjustment, color correction, contrast adjustment, edge enhancement, gamma correction, color filter array interpolation, color matrix correction, color enhancement, or the like.

Figure 18:
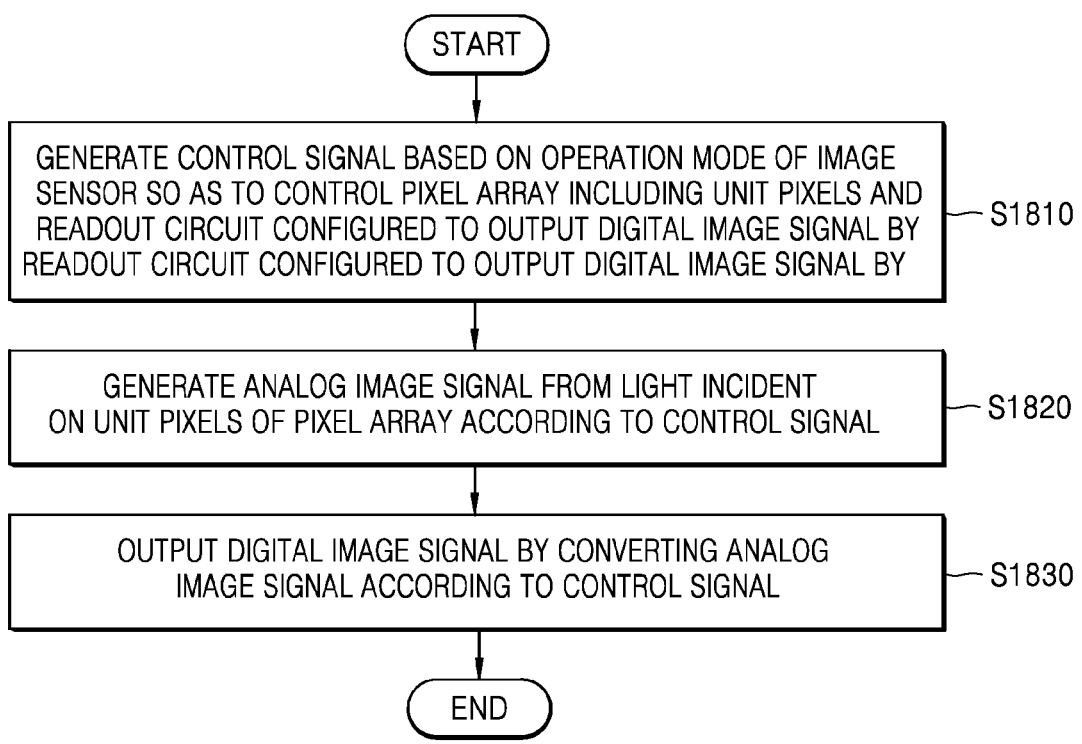
FIG. 18 is a view illustrating a method of driving an image sensor according to an example embodiment.

FIG. 18 is a view illustrating a method of driving the image sensor 1100 according to an example embodiment. While example embodiments have been described in which each of the components of the image sensor 1100 and their corresponding functionalities have been described separately, in one or more example embodiments, the image sensor 1100 may include a processor and an associated memory such as the memory 1600. The functionalities of one or more of the components of the image sensor 1100 described above (e.g., the functionalities of the control module/unit 1400) may be embodied as computer-readable instructions stored on the memory 1600, which may then be executed by the processor thus making the processor a special purpose processor for performing the functionalities of the image sensor 1100 as described above and as will be further described below.

In operation S1810, the image sensor 1100 may generate control signals according to an operation mode of the image sensor 1100 so as to control the pixel array 1110 including the unit pixels and the readout circuit 1120 configured to convert an analog image signal generated by the pixel array 1110 into a digital image signal. In this case, a first power voltage for driving the image sensor 1100 when the operation mode of the image sensor 1100 is an image recognition mode may be lower than a second power voltage for driving the image sensor 1100 when the operation mode of the image sensor 1100 is an image capture mode.

In operation S1820, the image sensor 1100 may generate an analog image signal by converting light incident on each unit pixels of the pixel array 1110 according to the control signal for controlling the pixel array 1110.

If the operation mode of the image sensor 1100 is the image recognition mode, the image sensor 1100 may maintain the transfer transistor of a pixel circuit of each unit pixel 1111 of the pixel array 1110 in an ON state according to the control signal. In addition, the image sensor 1100 may set an FD node connected to a photodiode PD to a reset voltage level by using the first power voltage, and then the image sensor 1100 may obtain the voltage level of the FD node changed as a result of exposure to incident light. In this manner, the image sensor 1100 may produce an analog image signal in the image recognition mode.

If the operation mode of the image sensor 1100 is a motion detection mode for detecting motions of a user or the image capturing apparatus 1000 including the image sensor 1100, unit pixels 1111 of a predetermined (and/or alternatively, desired) row of the pixel array 1110 of the image sensor 1100 may generate an analog image signal. In this case, a third power voltage for driving the image sensor 1100 may be equal to the first power voltage for driving the image sensor 1100 in the image recognition mode.

In operation S1830, the image sensor 1100 may convert the analog image signal into a digital image signal according to the control signal for controlling the readout circuit 1120. In this case, an image signal produced by the image sensor 1100 in the image recognition mode may have a lower degree of resolution than an image signal produced by the image sensor 1100 in the image capture mode.

In addition, a clock frequency of a first analog-digital converter of the readout circuit 1120 operating when the operation mode of the image sensor 1100 is the image recognition mode may be lower than a clock frequency of a second analog-digital converter of the readout circuit 1120 operating when the operation mode of the image sensor 1100 is the image capture mode.

In the image recognition mode, a circuit of each column of the readout circuit 1120 may be operated as a first circuit to convert an analog image signal into a digital image signal. In the image capture mode, the circuit of each column of the readout circuit 1120 may be operated as a second circuit to amplify an analog image signal and convert the amplified analog image signal into a digital image signal. In this case, the first circuit and the second circuit may share predetermined devices.

The first circuit may include an SAR ADC, and the second circuit may include a PGA and an SS ADC. In this case, the SAR ADC may include a capacitive digital-analog converter realized using a capacitor array of the PGA, a memory realized using a memory of a counter of the SS ADC, and a comparator realized using a comparator of the PGA or the SS ADC. In addition, the capacitive digital-analog converter may be realized by connecting capacitor arrays of the PGA respectively included in the circuits of at least two neighboring columns of the readout circuit 1120.

In the motion detection mode, the circuit of each column of the readout circuit 1120 may be operated as a third circuit to output a digital signal indicating whether a motion is detected or not by sampling an image signal of the current frame and an image signal of the previous frame of the unit pixels of the predetermined (and/or alternatively, desired) row, and checking a difference signal between the sampled two image signals. A line connecting latches, in which digital signals output from the circuits of the columns of the readout circuit 1120 are respectively stored, may be precharged with the third power voltage, and then a motion may be detected based on whether the precharged line is discharged when the digital signals stored in the latches are simultaneously read.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An image sensor configured to operate in a plurality of operation modes, the image sensor comprising:
    a pixel array including unit pixels configured to generate an analog image signal from incident light;
    a readout circuit configured to output a digital image signal by converting the analog image signal; and
    a control module configured to generate control signals for controlling operations of the pixel array and the readout circuit according to an operation mode of the image sensor,
    wherein a first power voltage for driving the image sensor when the operation mode of the image sensor is an image recognition mode for recognizing a body of a user of the image sensor, is lower than a second power voltage for driving the image sensor when the operation mode of the image sensor is an image capture mode for capturing images by the user.

2. The image sensor of claim 1, wherein each of the unit pixels comprises:
    a photodiode configured to generate a charge by photoelectrically converting the incident light;
    a transfer transistor configured to transmit the charge generated by the photodiode to a floating diffusion (FD) node;
    a reset transistor configured to set a reset voltage level of the FD node by using a power voltage applied to a drain terminal of the reset transistor;
    a drive transistor configured to receive a voltage level of the FD node as an input to a gate terminal of the drive transistor, the drive transistor being connected to the reset transistor as a source follower; and
    a select transistor connected to a source terminal of the drive transistor and configured to obtain the voltage level of the FD node,
    wherein when the operation mode of the image sensor is the image recognition mode, the transfer transistor is always in an ON state.

3. The image sensor of claim 2, wherein when the operation mode of the image sensor is the image recognition mode, the reset transistor is configured to set the reset voltage level of the FD node connected to the photodiode by using the first power voltage, and the select transistor is configured to obtain the voltage level of the FD node changed by the incident light.

4. The image sensor of claim 1, wherein a circuit of each column of the readout circuit is configured to,
    operate as a first circuit outputting a digital image signal by converting the analog image signal when the operation mode of the image sensor is the image recognition mode, and
    operate as a second circuit outputting a digital image signal by amplifying the analog image signal and converting the amplified analog image signal when the operation mode of the image sensor is the image capture mode,
    wherein the first circuit and the second circuit share a plurality of elements.

5. The image sensor of claim 4, wherein
    the first circuit comprises a successive approximation register analog-digital converter (SAR ADC), and
    the second circuit comprises a programmable gain amplifier (PGA) and a single slope analog-digital converter (SS ADC).

6. The image sensor of claim 5, wherein the SAR ADC comprises:
    a capacitive digital-analog converter based on a capacitor array of the PGA;
    a memory based on a memory of a counter of the SS ADC; and
    a comparator based on a comparator of the PGA or the SS ADC.

7. The image sensor of claim 6, wherein the capacitive digital-analog converter is formed by connecting capacitor arrays respectively included in circuits of at least two neighboring columns of the readout circuit.

8. The image sensor of claim 1, wherein
    when the operation mode of the image sensor is a motion detection mode for detecting a motion of the user or an image capturing apparatus comprising the image sensor, unit pixels of a row of the pixel array are used to generate the analog image signal, and a third power voltage for driving the image sensor in the motion detection mode is equal to the first power voltage.

9. The image sensor of claim 8, wherein circuits of columns of the readout circuit are configured to output a digital signal indicating whether a motion is detected or not by,
sampling an image signal of a current frame of the unit pixels of the row and an image signal of a previous frame of the unit pixels of the row, and
checking a difference signal between the sampled image signal of the current frame and the sampled image signal of the previous frame.

10. The image sensor of claim 9, wherein
the readout circuit is configured to precharge a line with the third power voltage, the line being configured to connect latches in which digital signals output from the circuits of the columns of the readout circuit are respectively stored, and
based on whether the line is discharged when the digital signals stored in the latches are simultaneously read, the readout circuit is configured to output whether a motion is detected.

11. An image capturing apparatus configured to operate in a plurality of operation modes, the image capturing apparatus comprising:
an image sensor configured to output an image signal by converting incident light;
a power supply unit configured to generate different power voltages;
a control unit configured to determine one of an image recognition mode in which a body of a user is recognized or an image capture mode in which the user captures images as a determined operation mode of the image sensor; and
a power change unit configured to apply a power voltage corresponding to the determined operation mode to the image sensor from the power supply unit,
wherein a first power voltage to be applied to the image sensor when the determined operation mode of the image sensor is the image recognition mode is lower than a second power voltage to be applied to the image sensor when the determined operation mode of the image sensor is the image capture mode.

12. The image capturing apparatus of claim 11, wherein if the control unit determines the operation mode to be a motion detection mode for detecting a motion of the user or the image capturing apparatus comprising the image sensor, an image signal corresponding to a row of a pixel array of the image sensor is generated, and
a third power voltage for driving the image sensor in the motion detection mode is equal to the first power voltage.

13. The image capturing apparatus of claim 12, further comprising:
a user input unit configured to receive a user manipulation input,
wherein if the user inputs an image capturing request in the image recognition mode, the control unit is configured to determine the image capture mode as the operation mode of the image sensor, and
if the control unit does not recognize the body of the user for a period of time in the image recognition mode, the control unit is configured to determine the motion detection mode as the operation mode of the image sensor.

14. An image sensor comprising:
a pixel array;
a readout circuit; and
a processor configured to generate one of a plurality of control signals for controlling operations of the pixel array and the readout circuit, each of the plurality of control signals corresponding to one of a plurality of modes of operation of the image sensor, the plurality of modes of operation including at least an image recognition mode and an image capturing mode, the image sensor operating based on a lower power voltage for driving the image sensor in the image recognition mode compared to when the image sensor operates in the image capturing mode.

15. The image sensor of claim 14, wherein
the plurality of modes of operation of the image sensor further includes a motion detection mode, and
the image sensor is configured to operate based on a same power voltage as when the image sensor operates in the image recognition mode.

16. The image sensor of claim 14, wherein
the pixel array is configured to generate an analog image signal from an incident light, and
the pixel array comprises:
a photodiode configured to generate a charge by photoelectrically converting incident light;
a transfer transistor configured to transmit the charge generated by the photodiode to a floating diffusion (FD) node;
a reset transistor configured to set a reset voltage level of the FD node by using a power voltage applied to a drain terminal of the reset transistor;
a drive transistor configured to receive a voltage level of the FD node as an input to a gate terminal of the drive transistor, the drive transistor being connected to the reset transistor as a source follower; and
a select transistor connected to a source terminal of the drive transistor and configured to obtain the voltage level of the FD node,
wherein when the image sensor is operating in the image recognition mode, the transfer transistor is always in an ON state.

17. The image sensor of claim 16, wherein when the image sensor is operating in the image recognition mode, the reset transistor is configured to set the reset voltage level of the FD node connected to the photodiode by using the power voltage, and the select transistor is configured to obtain the voltage level of the FD node changed by the incident light.

18. The image sensor of claim 16, wherein
the readout circuit is configured to output a digital signal by converting the analog image signal, and
a circuit of each column of the readout circuit is configured to,
operate as a first circuit outputting a digital image signal by converting the analog image signal when the operation mode of the image sensor is the image recognition mode, and
operate as a second circuit outputting a digital image signal by amplifying the analog image signal and converting the amplified analog image signal when the operation mode of the image sensor is the image capturing mode,
wherein the first circuit and the second circuit share a plurality of elements.

19. An apparatus comprising:
the image sensor of claim 14.

20. The apparatus of claim 19, wherein the apparatus is at least one of a camera, a mobile device, a portable electronic device.

\* \* \* \* \*